United States Patent [19]

Terashima et al.

[11] Patent Number: 5,460,981
[45] Date of Patent: Oct. 24, 1995

[54] SEMICONDUCTOR DEVICE HAVING INCREASED CURRENT CAPACITY

[75] Inventors: Tomohide Terashima; Gourab Majumdar, both of Fukuoka, Japan

[73] Assignee: Mitsubishi Denki Kabushiki Kaisha, Tokyo, Japan

[21] Appl. No.: 319,520

[22] Filed: Oct. 7, 1994

Related U.S. Application Data

[62] Division of Ser. No. 972,290, Nov. 5, 1992, Pat. No. 5,389,801.

[30] Foreign Application Priority Data

Mar. 16, 1992 [JP] Japan .................................... 4-057850

[51] Int. Cl.$^6$ ................................................ H01L 21/332
[52] U.S. Cl. ................... 437/6; 437/63; 437/149
[58] Field of Search ...................... 437/6, 41, 149, 437/911, 63, 64; 148/DIG. 126

[56] References Cited

U.S. PATENT DOCUMENTS

| | | | |
|---|---|---|---|
| 5,169,793 | 12/1992 | Okabe et al. | 437/6 |
| 5,254,864 | 10/1993 | Ogawa | 437/63 |
| 5,346,838 | 9/1994 | Ueno | 437/6 |

Primary Examiner—Chandra Chaudhari
Attorney, Agent, or Firm—Oblon, Spivak, McClelland, Maier, & Neustadt

[57] ABSTRACT

A general object of the present invention is to make a maximum controllable current large without exerting adverse effect on other characteristics. In a surface of an $n^-$ layer 2 formed on a $p^+$ substrate 1, p diffusion regions 3a, 3b and 3c are formed separated by $n^+$ diffusion regions 4a, 4b and an oxidation film 9. Above the p diffusion regions 3a and 3b, gate electrodes 5a and 5b are formed insulated from the surrounding by an oxidation film 6. An Al—Si electrode 7 is in contact with the p diffusion region 3a and the $n^+$ diffusion region 4a while a metal electrode 8 is in contact with the $p^+$ substrate 1. By virtue of interposition of the oxidation film 9, a thyristor consisting of the $n^+$ diffusion region 4a, p diffusion region 3a, $n^-$ layer 2 and $p^+$ substrate 1 is prevented from being actuated.

16 Claims, 31 Drawing Sheets

SEMICONDUCTOR DEVICE HAVING INCREASED CURRENT CAPACITY

This is a Division of application Ser. No. 07/972,290 filed on Nov. 5, 1992, now U.S. Pat. No. 5,389,801.

BACKGROUND OF THE INVENTION

1. Field of the Invention

The present invention relates to a semiconductor device in which voltage at a control electrode causes a current conducting state or a current blocking state.

2. Description of the Prior Art

FIG. 32 shows a cross section of a conventional semiconductor device called EST (Emitter Switched Thyristor). An $n^-$ layer 2 is formed on a $p^+$ substrate 1 by epitaxial growing, a p diffusion region 3 is formed on a surface of the $n^-$ layer 2, and further, $n^+$ diffusion regions 4a and 4b are formed separated from each other on a surface of the p diffusion region 3.

On the surface of the p diffusion region 3 between the $n^+$ diffusion regions 4a and 4b, a gate electrode 5a lies insulated from the surrounding by an insulating film 6. Also, on the surface of the p diffusion region 3 between the $n^+$ diffusion region 4b and the $n^-$ layer 2, a gate electrode 5b lies insulated from the surrounding by an insulating film 6. An Al—Si electrode 7 is in contact with the p diffusion region 3 and the $n^+$ diffusion region 4a, and a metal electrode 8 is in contact with a $p^+$ substrate 1. An equivalent circuit of the semiconductor device as configured above is shown in FIG. 33. In FIG. 33, a diffusion resistance extending from a part in contact with the electrode 7 up to the bottom of the electrode 5a is denoted by a resistance R1. Also, a diffusion resistance extending from the bottom of the electrode 5a up to the bottom of the electrode 5b is denoted by a resistance R2.

An npn transistor B11 has an emitter of the $n^+$ diffusion region 4a, a base of the P diffusion region 3, and a collector of the $n^+$ diffusion region 4b and $n^-$ layer 2, while an npn transistor B12 has an emitter of the $n^+$ diffusion region 4b, a base of the p diffusion region 3, and a collector of the $n^-$ layer 2. A pnp transistor B13 has an emitter of the $p^+$ substrate 1, a base of the $n^-$ layer 2, and a collector of the p diffusion region 3.

An n channel MOS transistor M11 has a source of the $n^+$ diffusion region 4a, a drain of the $n^+$ diffusion region 4b, a gate of the electrode 5a, and a back gate of the $p^+$ diffusion region 3, while an n channel MOS transistor M12 has a source of the $n^+$ diffusion region 4b, a drain of the $n^-$ layer 2, a gate of the electrode 5b, and a back gate of the p diffusion region 3.

Since the electrodes 5a and 5b are generally used at the same potential in such a semiconductor device, hereinafter "electrode 5" indicates both of them in block in some case. When a potential at the electrode 8 is raised with the electrodes 7 and 5 at the same potential, a depletion layer extends from a pn junction between the p diffusion region 3 and the $n^-$ layer 2 to retain voltage. In general, the $p^+$ substrate 1 and a portion where the $n^-$ layer 2 is in contact with the $p^+$ substrate are often designed as $n^+$ so as to prevent an end of the depletion layer from reaching the $p^+$ substrate 1 and punching through.

When voltage at the electrode 5 related to the electrode 7 is raised in the above mentioned situation, the p diffusion region 3 just below the electrode 5 causes an n inversion, and consequently, the transistors M11 and M12 turn on and the EST also turns on. FIG. 34 shows a flow of carriers in such an ON-state. In FIG. 34, a flow of electrons is shown by an arrow of broken line while a flow of holes is shown by an arrow of solid line.

Electrons flow from the $n^+$ diffusion region 4a through the $n^+$ diffusion region 4b to the $n^-$ layer 2 while holes are introduced from the $p^+$ substrate 1 to the p diffusion region 3, and the transistor B13 turns on. Generally, holes flow in accordance with an electron current density, and therefore, a relatively large amount of holes enter the p diffusion region 3 from the surrounding of the n inversion layer just below the electrode 5b. Many of the holes flowing in are led in a horizontal direction (a direction orthogonal to a thicknesswise direction) in the p diffusion region 3 and reach the electrode 7.

At this time, the p diffusion region 3 acting as the resistances R1 and R2 causes a potential at the p diffusion region 3 just below the $n^+$ diffusion region 4b to rise related to the electrode 7. On the other hand, the $n^+$ diffusion region 4b is linked through the $n^+$ diffusion region 4a and the inversion layer just below the electrode 5a to the electrode 7, potential rising at the $n^+$ diffusion region 4b is considerably small, compared with the above-mentioned potential rising at the p diffusion region 3. Thus, as holes flowing in the p diffusion region 3 increase, an area between the $n^+$ diffusion region 4b and the p diffusion region 3 is forward-biased, and electrons are introduced via the p diffusion region 3 into the $n^-$ layer 2 to turn the transistor B12 on.

The diffusion region 4b, p diffusion region 3, $n^-$ layer 2, and $p^+$ substrate 1 are components of a thyristor consisting of the transistors B12 and B13, and the thyristor is actuated when hole current increases to some extent or over. Actuation of the thyristor causes a current density in an ON-state of the EST to rise, and its ON-resistance drops.

Then, the n inversion layer just below the electrode 5a is extinguished when voltage at the electrode 5 is reduced, and the transistor M11 which is positioned in series with the thyristor consisting of the transistors B12 and B13 turns off. Consequently, electrons introduced from the emitter of the $n^+$ diffusion region 4b of the transistor B12 into the base of the p diffusion region 3 cannot be supplied, and a thyristor operation stops. The holes which has been led in the $n^-$ layer 2 in advance flow away from the p diffusion region 3 to the electrode 7. In this way, the EST turns off again.

The conventional semiconductor device is configured as mentioned above, and the thyristor consisting of the transistors B11 and B13 is actuated when current between the electrodes 7 and 8 is increased. When the thyristor is actuated in this portion, the electrode 5 comes into a current uncontrollable state (latch-up state). To avoid this, a device design where the resistance R1 takes a value as small as possible should be made so that voltage drop due to hole current flowing in the resistance R1 does not cause the transistor B11 to operate. Specifically, it is necessary to reduce the resistance R1 to make current between the electrodes 7 and 8 controllable by the electrode 5 (maximum controllable current) much larger.

It is also possible forming the p diffusion region 3 just below the $n^+$ diffusion region 4a deeply to reduce the resistance R1, and accordingly, a rate of holes flowing only in the p diffusion region 3 deeply formed to holes led from the $p^+$ substrate 1 into the electrode 7 rises. The former holes do not contribute to the operation of the thyristor consisting of the transistors B12 and B13, and therefore, a minimum current value (holding current) to retain the thyristor operation consequently becomes large. Thus raised maximum controllable current often causes adverse effects to other characteristics.

On the other hand, there is a limit to reduce a resistance rate of the p diffusion region 3.

SUMMARY OF THE INVENTION

According to the present invention, a method of manufacturing a semiconductor device comprises the steps of (a) preparing a first semiconductor layer of a first conductivity type having upper and lower major surfaces; (b) forming a second semiconductor layer of a second conductivity type having first through fourth regions successively located in a first direction orthogonal to a thicknesswise direction of the first semiconductor layer on the upper major surface of the first semiconductor layer; (c) forming a buried insulating film which is selectively buried in the second semiconductor layer, extending from at least a first end of the first region to the second region; (d) selectively forming a first control electrode in the second region above the second semiconductor layer; (e) selectively forming a second control electrode in the fourth region above the second semiconductor layer; (f) selectively forming a third semiconductor layer of the first conductivity type in the upper major surface of the second semiconductor layer, extending from the first region through the second and third regions to a first end of the fourth region; (g) selectively forming a fourth semiconductor layer of the second conductivity type contiguous to the buried insulating film in the third semiconductor layer, extending from a first end of the second region to at least a part of the first end of the first region; (h) selectively forming a fifth semiconductor layer of the second conductivity type contiguous to the buried insulating film in the third semiconductor layer, extending from a second end of the second region isolated from the first end of the second region through the third region to a part of the first end of the fourth region; (i) forming a first current electrode insulated from the first control electrode and connected to the third and fourth semiconductor layers in the first region; and (j) forming a second current electrode connected to the lower major surface of the first semiconductor layer.

Preferably, the third semiconductor layer positioned in the second region is formed so as to be thoroughly depleted in a state where withstand voltage is retained between the first and second current electrodes.

Also preferably, the step (f) includes the steps of (f-1) introducing a first impurity of the first conductivity type into a preparation obtained at the step (e); and (f-2) forming the third semiconductor layer by diffusing the first impurity.

Further preferably, the step (d) includes the steps of (d-1) selectively forming a first insulating film in the second region on the second semiconductor layer; and (d-2) forming the first control electrode on the first insulating film; the step (e) includes the steps of (e-1) selectively forming a second insulating film in the fourth region on the second semiconductor layer; (e-2) forming the second control electrode on the second insulating film; the step (i) includes the steps of (i-1) forming an electrode insulating film over the entire surface of a preparation obtained at the step (h); (i-2) making an aperture through the electrode insulating film in a part of the first region and exposing a part of the third and fourth semiconductor layers; and (i-3) forming the first current electrode over the entire surface of a preparation obtained at the step (i-2).

Still further preferably, the buried insulating film is formed extending to a first end of the third region.

Yet preferably, the step (c) includes the steps of (c-1) forming an ion implantation mask for exposing the second semiconductor layer at least from part of the first region to the second region; (c-2) implanting a specified ion through the ion implantation mask into the second semiconductor layer; and (c-3) forming the buried insulating film by annealing.

Still yet preferably, the chief element of the second semiconductor layer is silicon, and the specified ion is an oxygen ion.

Also preferably, an the step (f), the third semiconductor layer is formed so that the boundary between the second semiconductor layer and the buried insulating film remains, and the buried insulating film and the second and fifth semiconductor layers surround an end of the third semiconductor layer to isolate the remaining part of the third semiconductor layer.

Preferably, at the step (g), the buried insulating film and the fourth and fifth semiconductor layers isolate part of the third semiconductor layer other than the end thereof from the remaining of the third semiconductor layer.

Further preferably, the fourth semiconductor layer is formed intermittently along a second direction orthogonal to the thicknesswise direction and the first direction.

Preferably, at the step (f), the third semiconductor layer is formed so as to lie under the buried insulating film and link up extending from the first region to the first end of the fourth region.

Also preferably, the step (f-1) includes the steps of (f-1-1) implanting ions of the first impurity of the first conductivity type into a preparation obtained at the step (e), and the ions of the first impurity permeates into the buried insulating film.

Further preferably, at the step (f-2), the first impurity permeates into the buried insulating film and diffuses.

Yet preferably, the buried insulating film and the fourth and fifth semiconductor layer isolate an end of the third semiconductor layer from the remaining of the third semiconductor layer to form a sixth semiconductor layer of the first conductivity type.

Still preferably, the fourth semiconductor layer is intermittently formed along the second direction orthogonal to the thicknesswise direction and the first direction.

Still yet preferably, the fifth semiconductor layer is intermittently formed along the second direction orthogonal to the thicknesswise direction and the first direction.

Still further preferably, the fourth semiconductor layer is intermittently formed along the second direction orthogonal to the thicknesswise direction and the first direction, and the buried insulating film is intermittently formed along the second direction, intervening between the fourth and second semiconductor layers in the thicknesswise direction.

The present invention is also directed to a semiconductor device which comprises a first semiconductor layer of a first conductivity type having upper and lower major surfaces; a second semiconductor layer of a second conductivity type formed on the upper major surface of the first semiconductor layer and having first through fourth regions successively located in a first direction orthogonal to a thicknesswise direction of the first semiconductor layer; a buried insulating film selectively buried in the second semiconductor layer, extending from at least a first end of the first region to the second region; a first control electrode selectively formed in the second region above the second semiconductor layer; a second control electrode selectively formed in the fourth region above the second semiconductor layer; a third semiconductor layer of the first conductivity type formed in an upper major surface of the second semiconductor layer, extending from the first region through second and third regions to and in a first end of the fourth region; a fourth semiconductor layer of the second conductivity type formed in the third semiconductor layer contiguous to the buried insulating film, extending from a first end of the second region to at least part of the first end of the first region; a fifth semiconductor layer of the second conductivity type formed in the third semiconductor layer contiguous to the buried insulating film, extending from a second end of the second region isolated from the first end of the second region through the third region to part of the first end of the fourth region; a first current electrode insulated from the first control electrode and connected to the third and fourth semiconductor layers in the first region; and a second current electrode connected to the lower major surface of the first semiconductor layer.

The semiconductor device further includes a first insulating film interposing between the first control electrode and the third semiconductor layer in the second region; a second insulating film interposing between the second control electrode and the second semiconductor layer in the fourth region; and an electrode insulating film insulating the first current electrode from the first and second control electrodes.

Further preferably, the buried insulating film is formed extending to a first end of the third region.

Still preferably, the third semiconductor layer positioned in the second region are thoroughly depleted in a state where withstand voltage is retained between the first and second current electrodes.

Still further preferably, the buried insulating film and the second and fifth semiconductor layers surround an end of the third semiconductor layer to isolate from the remaining of the third semiconductor layer.

Yet preferably, the buried insulating film and the fourth and fifth semiconductor layers isolate part of the third semiconductor layer other than the end thereof from the remaining of the third semiconductor layer.

Still yet preferably, the fourth semiconductor layer is intermittently formed along a second direction orthogonal to the thicknesswise direction and the first direction.

Also preferably, the third semiconductor layer is also formed in a lower portion of the buried insulating film in the second region, linking up extending from the first region to the first end of the fourth region.

Preferably, the buried insulating film and the fourth and fifth semiconductor layers isolate an end of the third semiconductor layer from the remaining of the third semiconductor layer.

Further preferably, the fourth semiconductor layer is intermittently formed along a second direction orthogonal to the thicknesswise direction and the first direction.

Still further preferably, the fifth semiconductor layer is intermittently formed along a second direction orthogonal to the thicknesswise direction and the first direction.

Yet preferably, the fourth semiconductor layer is intermittently formed along a second direction orthogonal to the thicknesswise direction and the first direction, and the buried insulating film is intermittently formed along the second direction, interposing between the fourth and third semiconductor layers in the thicknesswise direction.

In another aspect of the present invention, a semiconductor device comprises a first semiconductor layer of a first conductivity type having upper and lower major surfaces; a second semiconductor layer of a second conductivity type formed on the upper major surface of the first semiconductor layer and having first through fifth regions successively located in a first direction orthogonal to a thicknesswise direction of the first semiconductor layer; a buried insulating film selectively buried in the second semiconductor layer in at least the first and second regions; a first control electrode selectively formed in the second region above the second semiconductor layer; a second control electrode selectively formed in the fourth region above the second semiconductor layer; a third semiconductor layer of the first conductivity type formed in an upper major surface of the second semiconductor layer, extending from the first region through the second and third regions to a first end of the fourth region; a fourth semiconductor layer of the second conductivity type formed contiguous to the buried insulating film in the third semiconductor layer, extending from a first end of the second region to the first region; a fifth semiconductor layer of the second conductivity type formed contiguous to the buried insulating film in the third semiconductor layer, extending from a second end of the second region isolated from the first end of the second region through the third region to part of the first end of the fourth region, surrounding an end of the third semiconductor layer together with the buried insulating film and the second semiconductor layer to isolate the remaining of the third semiconductor layer; a sixth semiconductor layer of the first conductivity type formed in an upper major surface of the second semiconductor layer, extending from a second end of the fourth region isolated from the first end of the fourth region to the fifth region; a first current electrode insulated from the first and second control electrodes and connected to the fourth semiconductor layer in the first region and to the sixth semiconductor layer in the fifth region; and a second current electrode connected to the lower major surface of the first semiconductor layer.

Preferably, the buried insulating film and the fourth and fifth semiconductor layer isolate part of the third semiconductor layer other than the end thereof from the remaining of the third semiconductor layer.

Further preferably, the fourth semiconductor layer is intermittently formed along a second direction orthogonal to both of the thicknesswise direction and the first direction, and the first current electrode is connected to the third semiconductor layer in the first region.

Still further preferably, the semiconductor device further includes a seventh semiconductor layer of the first conductivity type formed on a surface of the second semiconductor layer between the third and sixth semiconductor layers under the second control electrode.

In the first aspect of the semiconductor device according to the present invention, the buried insulating film prevents the fourth semiconductor layer together with the third semiconductor layer under the fourth semiconductor layer and the first and second semiconductor layers from making up a thyristor, and hence, a latch-up state caused by a thyristor operation can be avoided. Thus, a maximum controllable current can be made large, and the existence of the buried insulating film is no longer a cause of adverse effects to other characteristics.

In the second aspect of the semiconductor device according to the present invention, the third semiconductor layer does not lie under the fourth semiconductor layer, and therefore, the fourth semiconductor layer together with the third semiconductor layer and the first and second semiconductor layers under the fourth semiconductor layer do not make up a thyristor. Furthermore, in turning off this semiconductor device, the second control electrode causes the second semiconductor layer between the third and sixth semiconductor layers to invert so as to make a channel, which connects the first current electrode to the third semiconductor layer, and therefore, enhancement of withstand (or breakdown) voltage, stabilization of withstand voltage, and improvement of a turn-off speed can be accomplished without reducing the maximum controllable current.

Accordingly, it is an object of the present invention to provide a semiconductor device having a large maximum controllable current without adverse effects to other characteristics.

These and other objects, features, aspects, and advantages of the present invention will become more apparent from the following detailed description of the present invention when taken in conjunction with the accompanying drawings.

DESCRIPTION OF THE PREFERRED EMBODIMENT

A. First Preferred Embodiment

Figure 1:
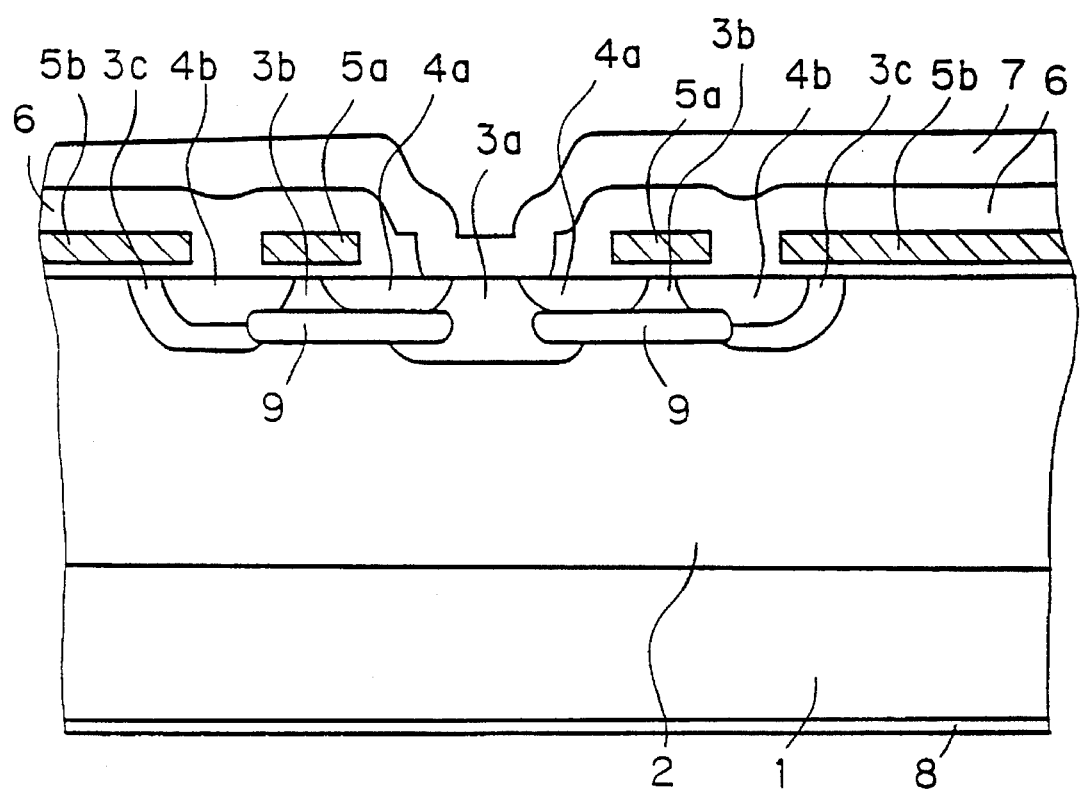
FIG. 1 is a sectional side view of a first preferred embodiment of the present invention.

FIG. 1 shows a first preferred embodiment of a semiconductor device according to the present invention. An $n^-$ layer 2 is deposited on a $p^+$ substrate 1 by epitaxial growing, and p diffusion regions 3a, 3b and 3c are formed in a surface of the $n^-$ layer 2. Furthermore, $n^+$ diffusion regions 4a and 4b are formed on surfaces of the p diffusion regions 3a, 3b and 3c so as not to be contiguous to each other. The p diffusion region 3b is separated from the p diffusion regions 3a and 3c by an oxidation film 9 which is an insulator.

On the surface of the p diffusion region 3b between the $n^+$ diffusion region 4a and $n^+$ diffusion region 4b, a gate electrode 5a lies insulated from the surrounding by an oxidation film 6 which is an insulator. Further, on the surface of the p diffusion region 3c between the $n^+$ diffusion region 4b and the $n^-$ layer 2, a gate electrode 5b lies insulated from the surrounding by the oxidation film 6. An Al—Si electrode 7 is in contact with the p diffusion region 3a and the $n^+$ diffusion region 4a while a metal electrode 8 is in contact with the $p^+$ substrate 1.

Figure 2:
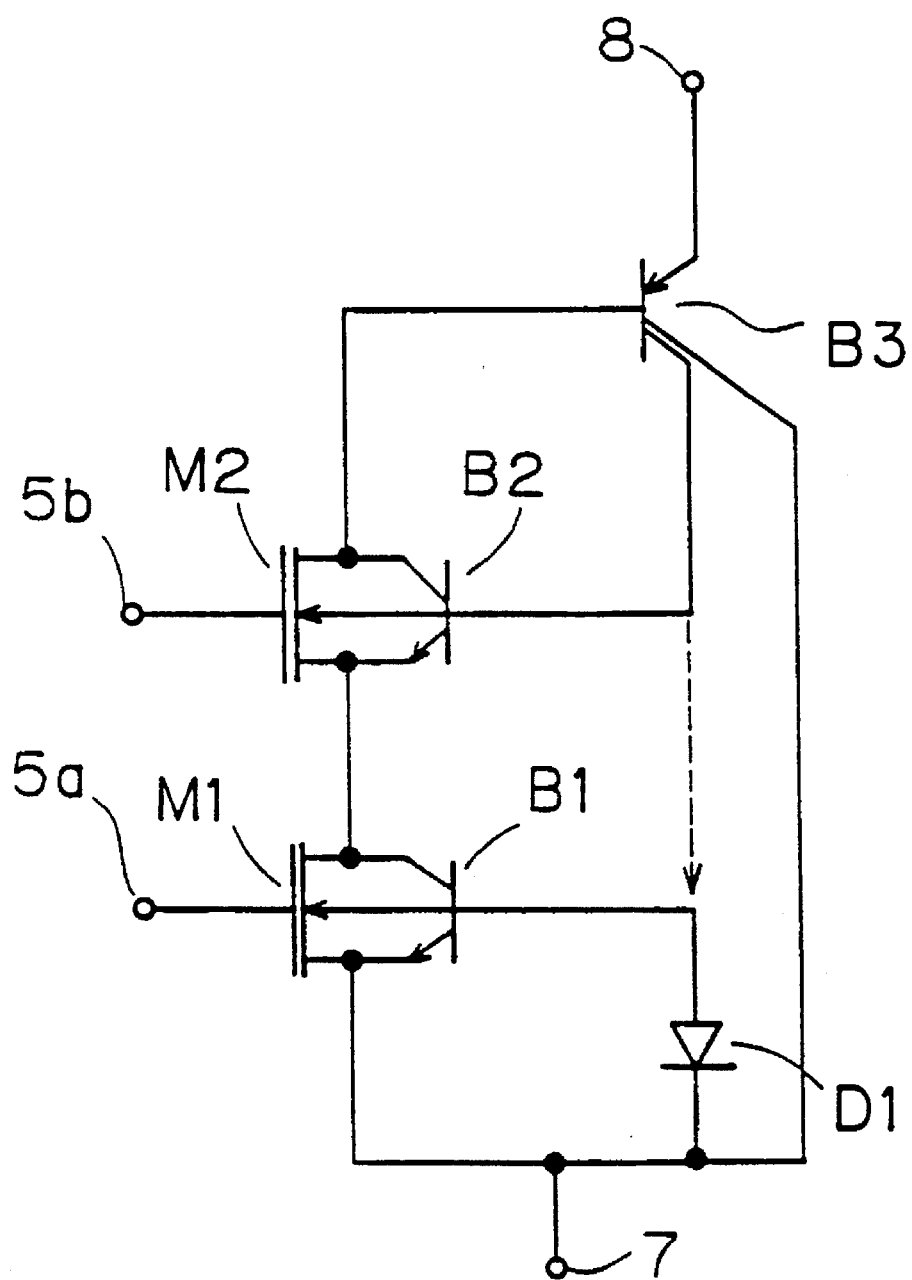
FIG. 2 is an equivalent circuit diagram of the first preferred embodiment.

An equivalent circuit of the first preferred embodiment is shown in FIG. 2. An npn transistor B1 has an emitter of the $n^+$ diffusion region 4a, a base of the p diffusion region 3b, and a collector of the $n^+$ diffusion region 4b, and npn transistor B2 has an emitter of the $n^+$ diffusion region 4b, a base of the p diffusion region 3c, and a collector of the $n^-$ layer 2. A pnp transistor B3 has an emitter of the $p^+$ substrate 1, and a base of the $n^-$ layer 2, and a collector of the p diffusion regions 3a and 3c. It is not indicated by a diode D1 that the first preferred embodiment is equipped with a new diode, but that the base of the transistor B1 is floating. This manner is used in other preferred embodiment.

An n channel MOS transistor M1 has a source of the $n^+$ diffusion region 4a, a drain of the n$^+$ diffusion region 4b, a gate of the electrode 5a, and a back gate of the p diffusion region 3b, and an n channel MOS transistor M2 has a source of the n$^+$ diffusion region 4b, a drain of the n$^-$ layer 2, a gate of the electrode 5b, and a back gate of the p diffusion region 3c.

In such a semiconductor device, the electrodes 5a and 5b are generally used at the same potential, and therefore, hereinafter "electrode 5" is sometimes used in block to designate both of them.

When a potential at the electrode 8 is raised with the electrodes 7 and 5 at the same potential, a depletion layer extends from a pn junction between the p diffusion regions 3a and 3c and the n$^-$ layer 2 to retain voltage. In general, the p$^+$ substrate 1 and a portion where the n$^-$ layer 2 is in contact with the p$^+$ substrate are often designed as n$^+$ type so as to prevent an end of the depletion layer from reaching the p$^+$ substrate 1 and punching through.

Figure 3:
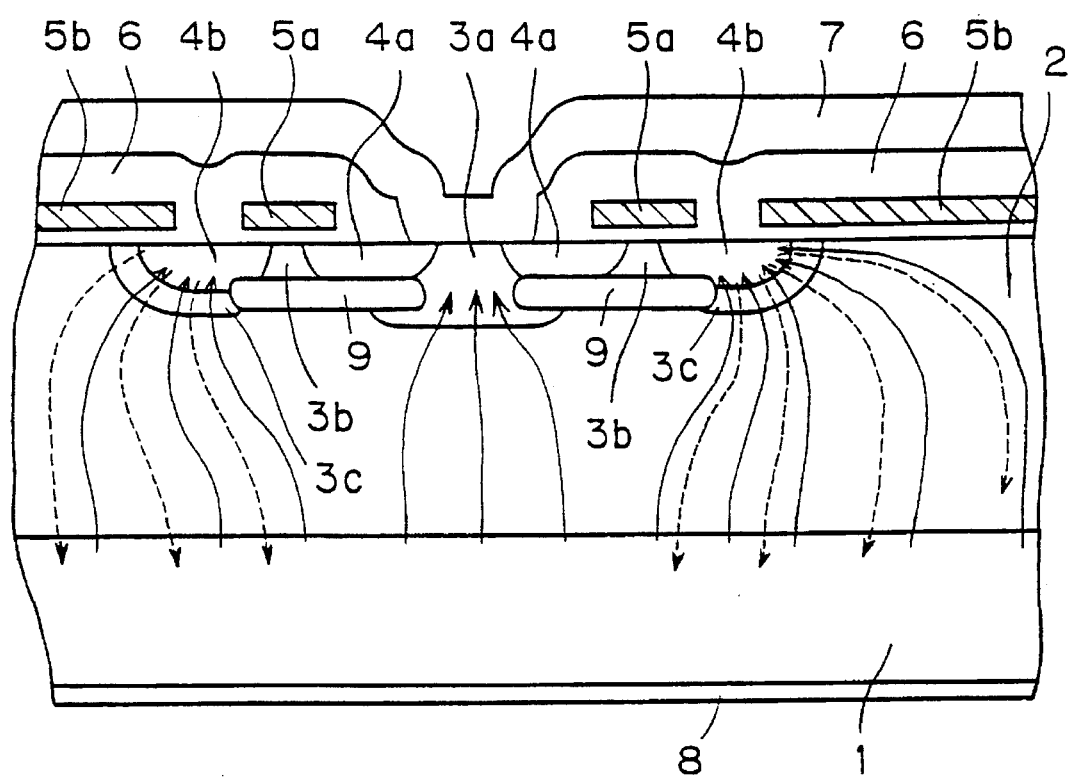
FIG. 3 is a sectional side view showing a flow of carriers in an On-state of the first preferred embodiment.

When voltage at the electrode 5 related to the electrode 7 is raised in the above mentioned situation, the p diffusion regions 3b and 3c just below the electrodes 5a and 5b are negatively inverted, and consequently, the transistors M1 and M2 turn on and the semiconductor device shown in FIG. 1 also turns on. FIG. 3 shows a flow of carriers in such an On-state. In FIG. 3, a flow of electrons is shown by an arrow of broken line while a flow of holes is shown by an arrow of solid line.

Electrons flow from the n$^+$ diffusion region 4a through the n$^+$ diffusion region 4b to the n$^-$ layer 2 while holes are introduced from the p$^+$ substrate 1 to the p diffusion regions 3a and 3c, and the transistor B3 turns on. Generally, holes flow in accordance with an electron current density, and therefore, a relatively large amount of holes enter the p diffusion region 3c from the surrounding of the n inversion layer just below the electrode 5b. Many of the holes flowing in are led in the n$^+$ diffusion region 4b, and the transistor B2 turns on.

The diffusion region 4b, p diffusion region 3c, n$^-$ layer 2, and p$^+$ substrate 1 together make up the thyristor consisting of the transistors B2 and B3, and the thyristor is actuated when hole current increases to some extent or over. Actuation of the thyristor causes a current density in an On-state to rise, and On-resistance of the thyristor consisting of the transistors B2 and B3 drops. Also, the total On-resistance of the semiconductor device is the sum of On-transistor of the transistor M1 and On-resistance of the thyristor consisting of the transistors B2 and B3, accordingly it also drops.

In the first preferred embodiment, holes led in the p diffusion region 3c almost recombinate in the n$^+$ diffusion region 4b and do not reach the p diffusion region 3b (in FIG. 2, this is indicated by an arrow of broken line). Since a base of the transistor B2 is in a floating state and its potential is easily raised, the transistor B2 is easily forward-biased between its emitter and base, and accordingly, a thyristor is easily actuated. Hence, it is possible to make a holding current smaller, compared with a the prior art design.

Figure 32:
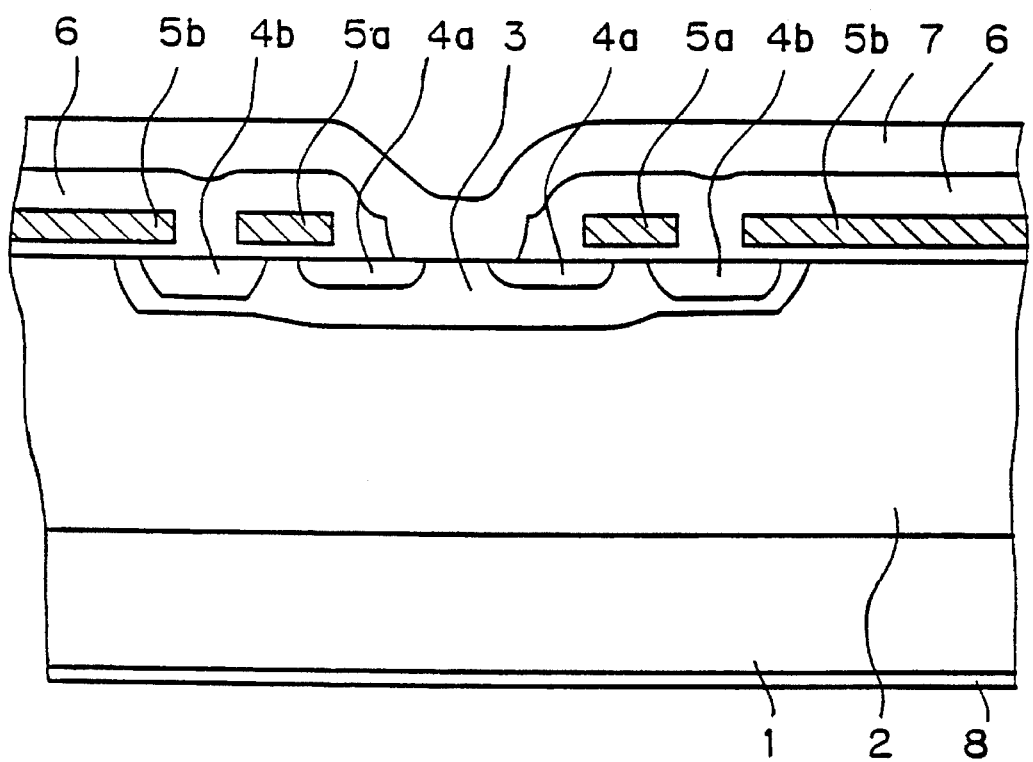
FIG. 32 is a sectional side view of a conventional semiconductor device.
Figure 33:
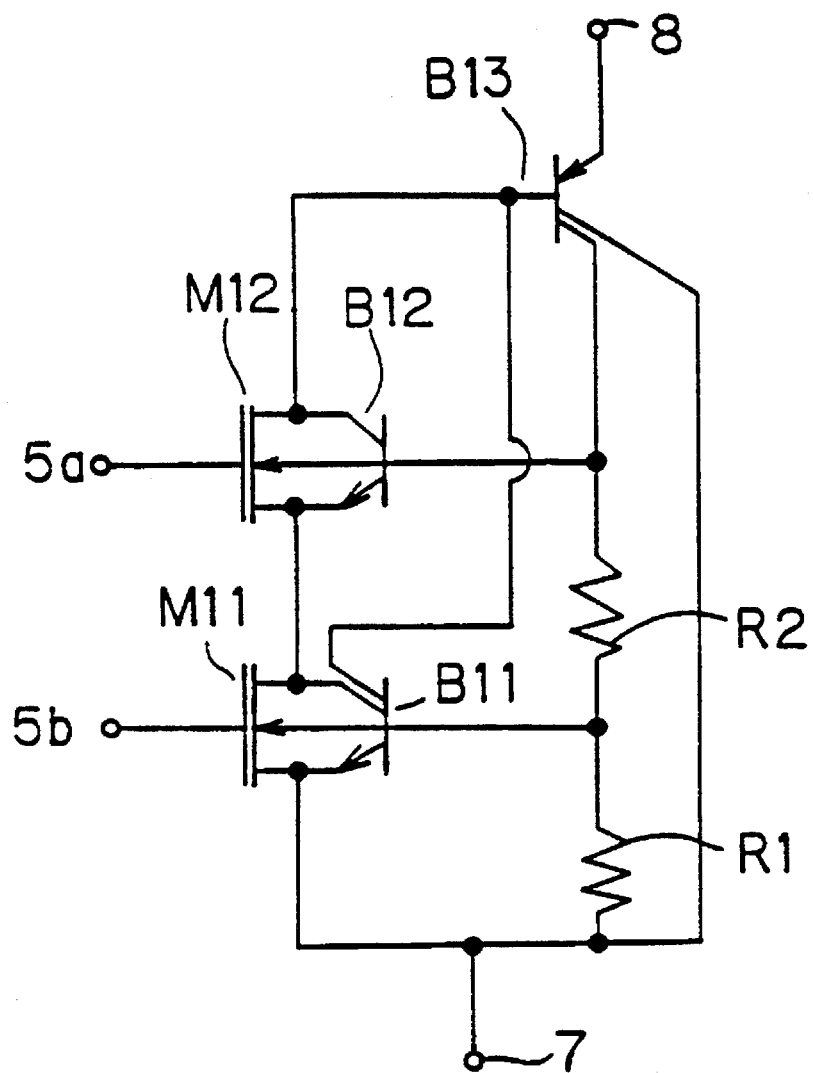
FIG. 33 is an equivalent circuit diagram of a conventional semiconductor device.
Figure 34:
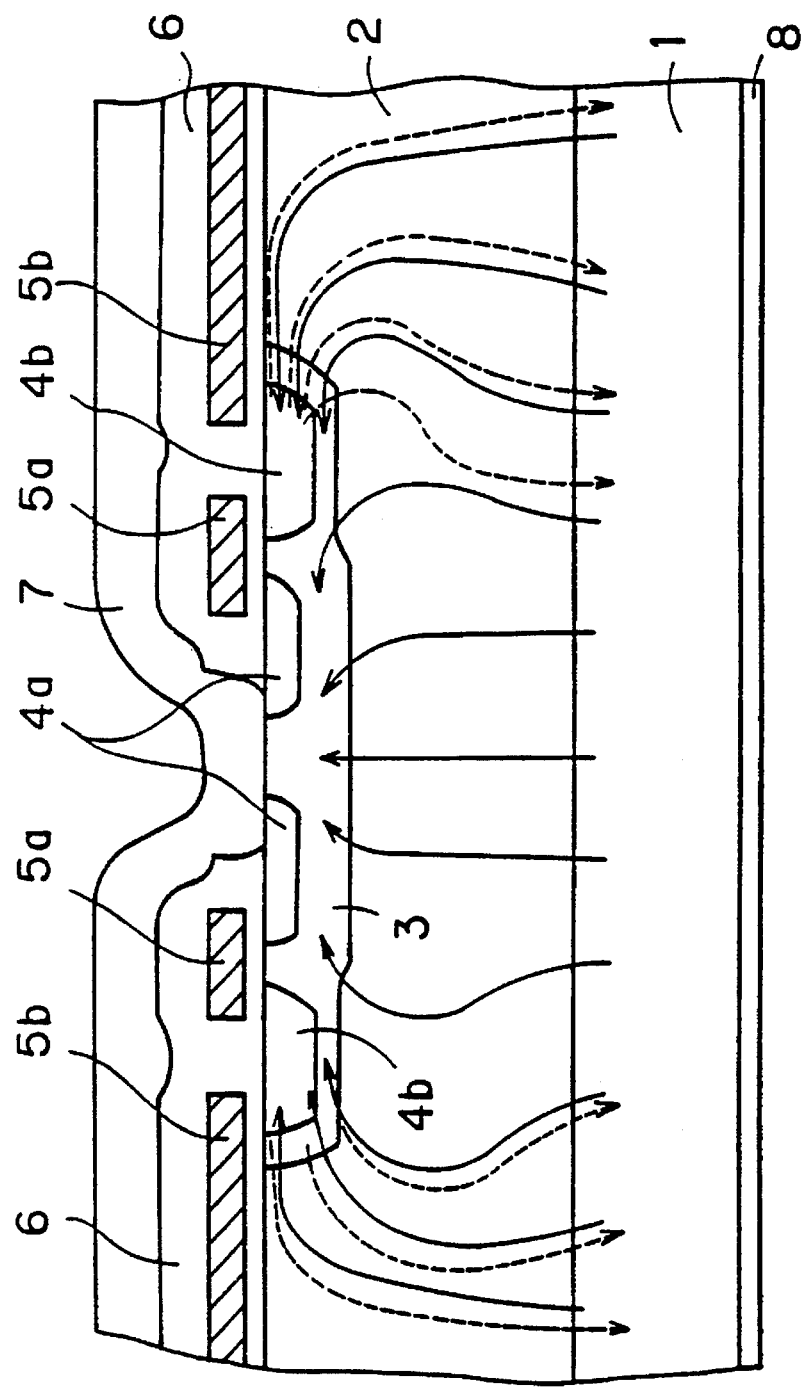
FIG. 34 is a sectional side view showing a flow of carriers in an On-state of the conventional semiconductor device.

In the prior art embodiment shown in FIG. 32, because of the existence of resistances R1 and R2, voltage drop which the hole current causes in part of the resistance R1 likely to lead to the risks of latch up. As shown in FIG. 2, however, the first preferred embodiment does not include the resistance R2. This is because holes introduced in the n$^+$ diffusion region 4b almost recombinate electrons in the n$^+$ diffusion region 4b, and no hole current is supplied to the p diffusion region 3b acting as the base of the transistor B1. Thus, great voltage drop hardly arises between the emitter and base of the transistor B1, and there are no risks of latch up caused by the actuation of the thyristor consisting of the transistors B1 and B3.

When voltage at the electrode 5 is reduced, the n inversion layer just below the electrode 5a disappears, and the transistor M1 positioned in series to the thyristor consisting of the transistors B2 and B3 turns off. Thus, electrons to be introduced from the n$^+$ diffusion region 4b acting as the emitter of the transistor B2 to the p diffusion region 3c acting as its base cannot be supplied, and the thyristor operation is stopped. Holes which has been introduced in the n$^-$ layer 2 in advance flow away from the p diffusion region 3a to the electrode 7. In this way, the semiconductor device shown in FIG. 1 turns off again.

Making the sufficiently thin p diffusion region 3b, the p diffusion region 3b is thoroughly depleted when the surface of the p diffusion region 3b just below the electrode 5a is negatively inverted until an end of the depletion layer can reach the oxidation film 9. In this case, electric field in a direction perpendicular to the electrode 5a is mainly supported in the oxidation film 9 so that the electric field in the n inversion layer is eased. Thus, a mobility of electrons in the n inversion layer rises, and On-resistance of the transistor M1 can be further reduced. In this case, moreover, the transistor B1 disappears because the p diffusion region 3b is almost depleted. The transistor B3 can not comprise the thyristor without the transistor B1, and therefore, there is much smaller possibility of latch up.

Figure 4:
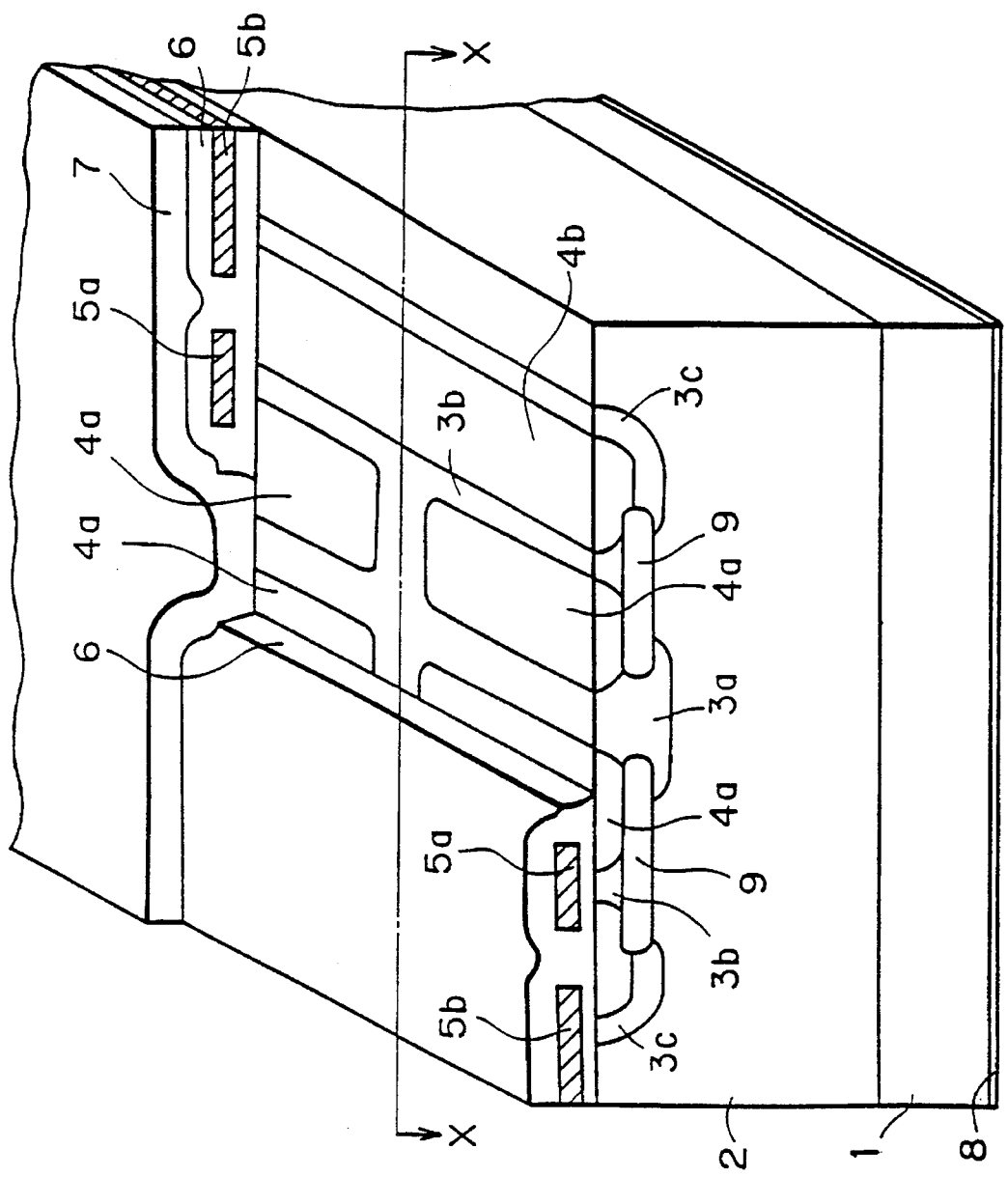
FIG. 4 is a partial sectional view of a variation of the first preferred embodiment.
Figure 5:
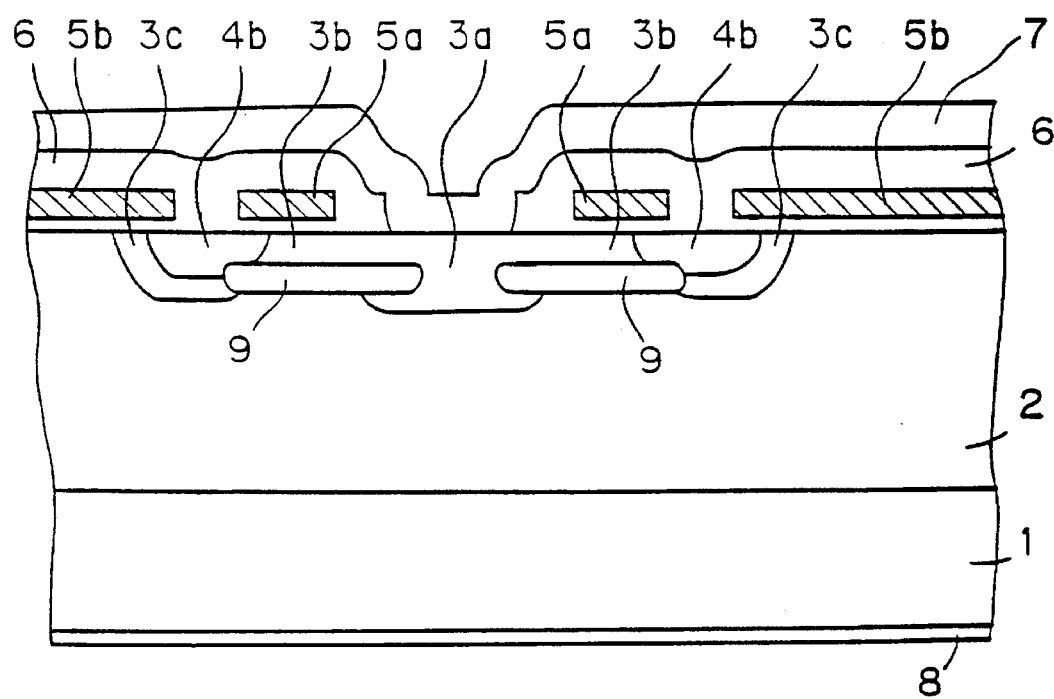
FIG. 5 is a X—X sectional view regarding FIG. 4.

Although, in the first preferred embodiment, the back gate of the transistor M1 is in floating because the electrode 7 is not in contact with the p diffusion region 3b, the electrode 7 and p diffusion region 3b may be in contact with each other so as to stabilize back gate voltage. The electrode 7 and p diffusion region 3b can be in contact with each other by discretely forming the n$^+$ diffusion region 4a so that the p diffusion regions 3a and 3b are partially in contact with each other in a direction perpendicular to a cross section shown in FIG. 1. FIGS. 4 and 5 show such configurations as variations of the first preferred embodiment.

A cross section presented at the front of FIG. 4 shows a configuration shown in FIG. 1, and in this cross section, the p diffusion regions 3a and 3b are discretely disposed. However, there is no n$^+$ diffusion region 4a in an X—X section of FIG. 4 shown in FIG. 5, the p diffusion regions 3a and 3b are in contact with each other, and the p diffusion region 3b can be connected to the electrode 7 by the intervening p diffusion region 3a.

In this case, the diode D1 comprising of the electrode 7 and the base of the transistor B1 is short-circuited in FIG. 2. Thus, almost no voltage drop arises between the emitter and base of the transistor B1.

Figure 6:
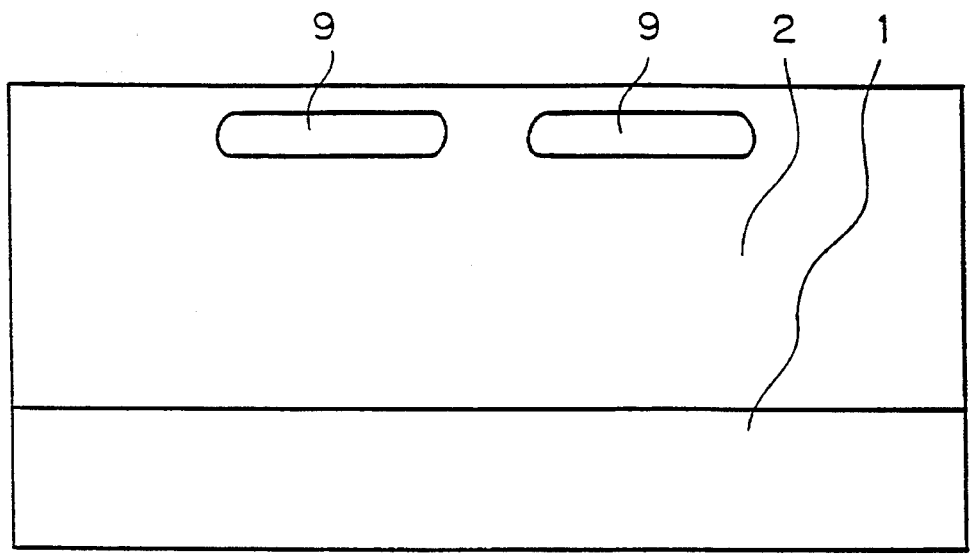
FIG. 6 is a sectional side view showing a method of manufacturing the first preferred embodiment in the order of process steps.

Then, a method of manufacturing the first preferred embodiment will be described with reference to FIGS. 6 through 11. First, the n$^-$ layer 2 is formed on the p$^+$ substrate 1 by epitaxial growing. Then, oxygen ions implantation with a mask of resist (not shown) (SIMOX; Separation by IMplanted OXygen) is performed, and after the resist is removed, annealing is performed to selectively form the oxidation film 9 in the n$^-$ layer 2 (FIG. 6).

Figure 7:
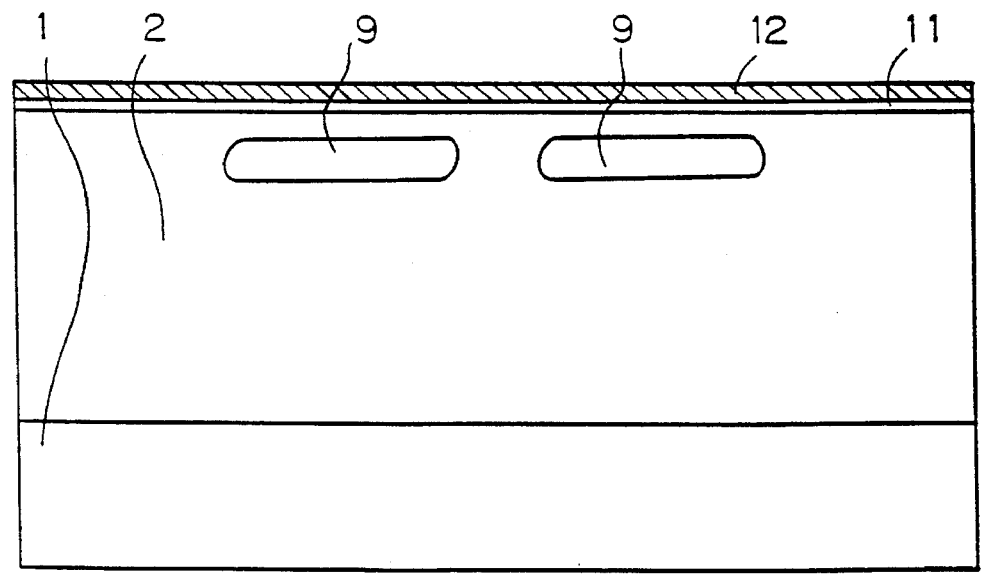
FIG. 7 is a sectional side view showing the method of manufacturing the first preferred embodiment in the order of process steps.

Next, after an oxidation film 11 is formed over the entire surface of the upper major surface of the n$^-$ layer 2 by thermal oxidation, a polysilicon film 12 is further formed over the entire surface of the oxidation film 11 (FIG. 7).

Figure 8:
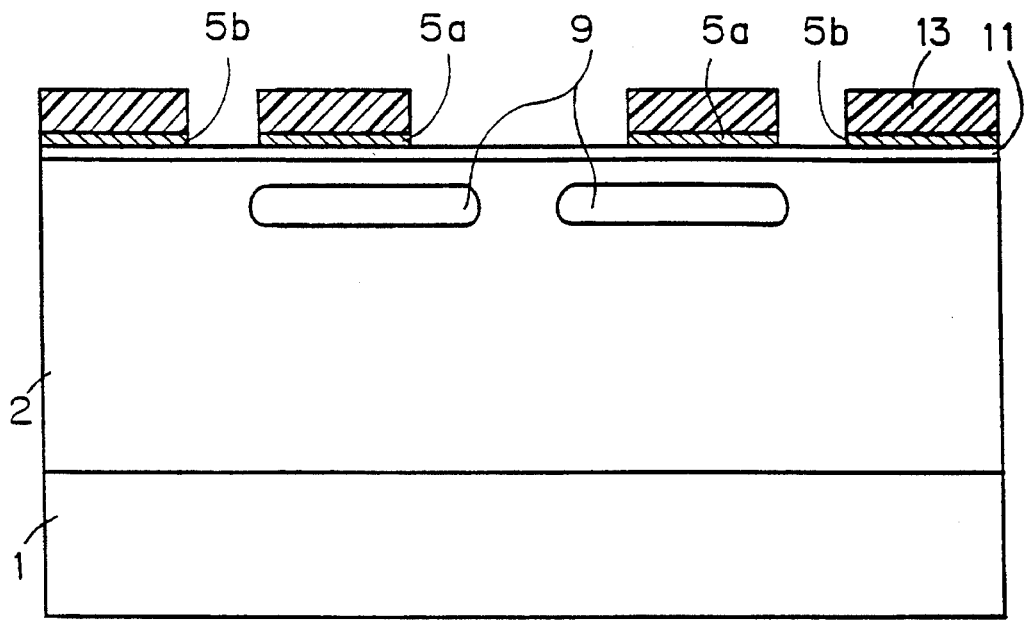
FIG. 8 is a sectional side view showing the method of manufacturing the first preferred embodiment in the order of process steps.

A resist 13 is selectively formed on the polysilicon film 12, and the polysilicon film 12 is etched with a mask of the resist 13 to form the electrodes 5a and 5b. Then, boron is implanted in the entire surface of the resultant preparation (FIG. 8).

Figure 9:
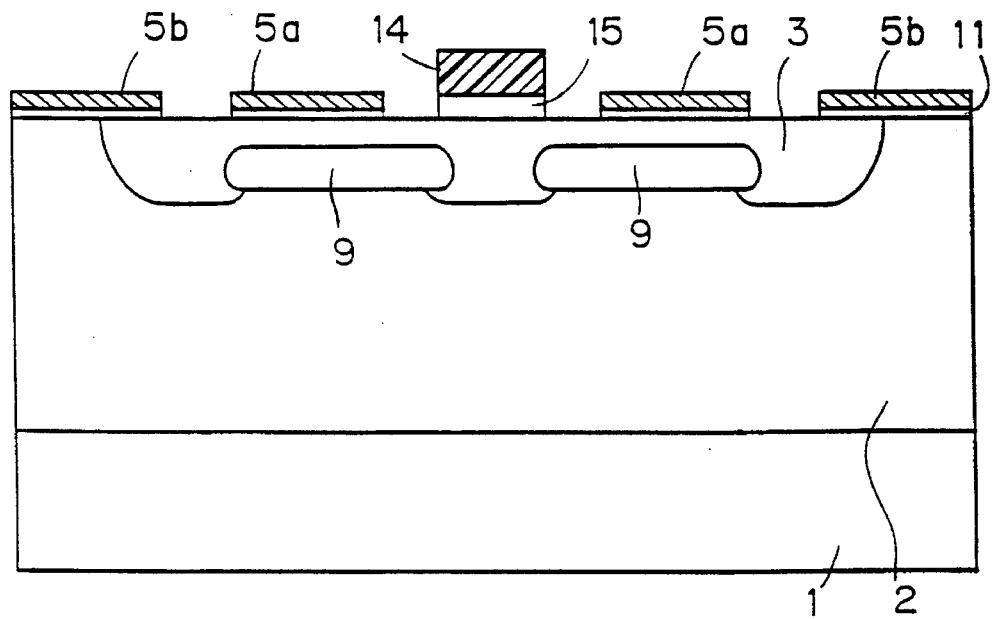
FIG. 9 is a sectional side view showing the method of manufacturing the first preferred embodiment in the order of process steps.

Then, annealing is performed to form the p diffusion region 3. Implanted boron is blocked by the resist 13 and the electrodes 5a and 5b, but diffusion of the boron caused by the annealing proceeds toward the inside of the surface of the substrate, and the p diffusion region 3 is also formed under the electrode 5a. However, since diffusion of boron is restricted by the oxidation film 9, the p diffusion region is not formed under the oxidation film 9. An oxidation film 15 is formed on an upper major surface of this preparation in annealing, a resist 14 is selectively formed thereover, and then, the oxidation film 15 is etched with a mask of the resist 14. In the entire surface of the resultant preparation, arsenic is implanted (FIG. 9).

After that, annealing is performed to form the $n^+$ diffusion regions 4a and 4b, which separate the p diffusion region 3 into regions 3a, 3b and 3c. Diffusion of arsenic is restricted by the oxidation film 9, and hence, no $n^+$ diffusion region is formed under the oxidation film 9 (FIG. 10).

Figure 10:
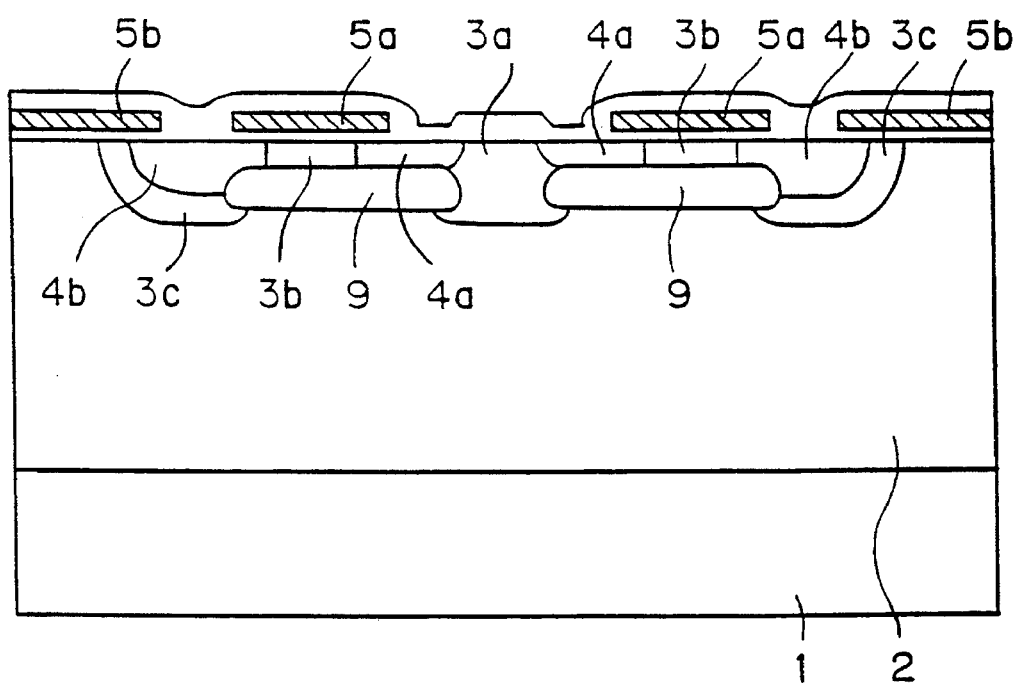
FIG. 10 is a sectional side view showing the method of manufacturing the first preferred embodiment in the order of process steps.
Figure 11:
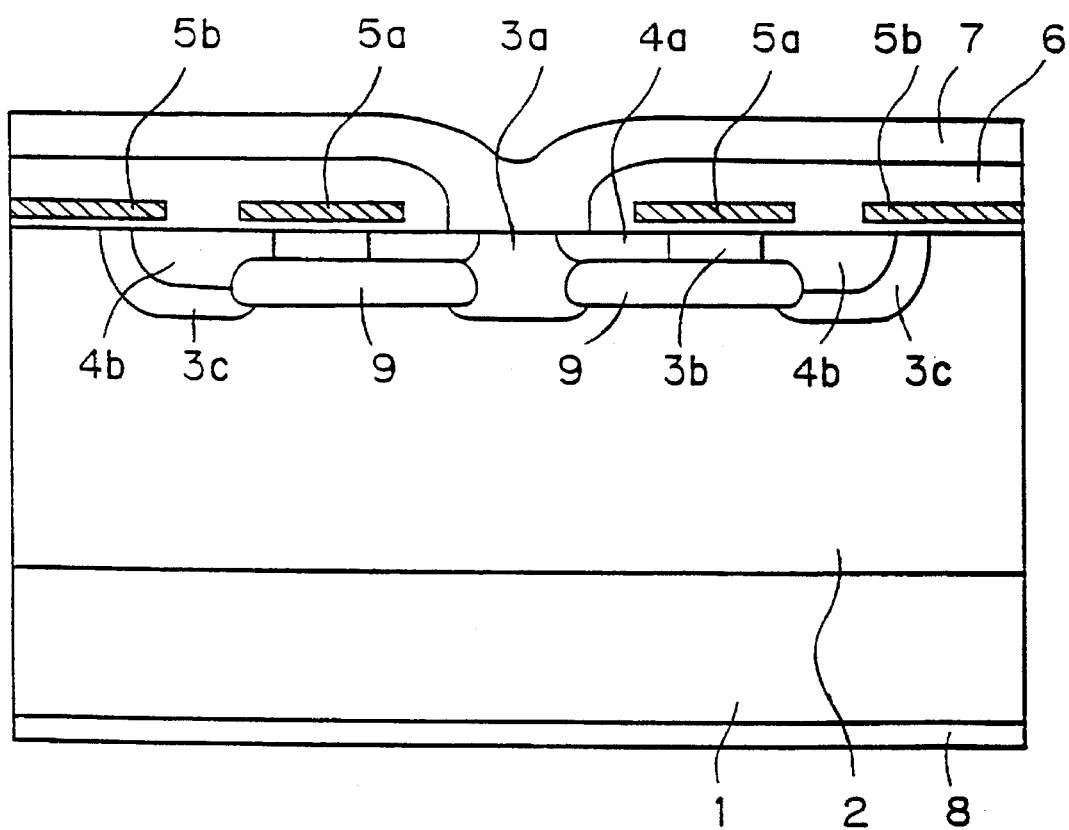
FIG. 11 is a sectional side view showing the method of manufacturing the first preferred embodiment in the order of process steps.

After an oxidation film is formed over the entire surface of the preparation obtained in FIG. 10, the oxidation film is etched with a resist mask (not shown) to selectively form the oxidation film 6. Moreover, the electrode 7 is formed by Al—Si sputtering. Metal deposition is performed on the bottom surface of the preparation to form the electrode 8 (FIG. 11).

B. Second Preferred Embodiment

Figure 12:
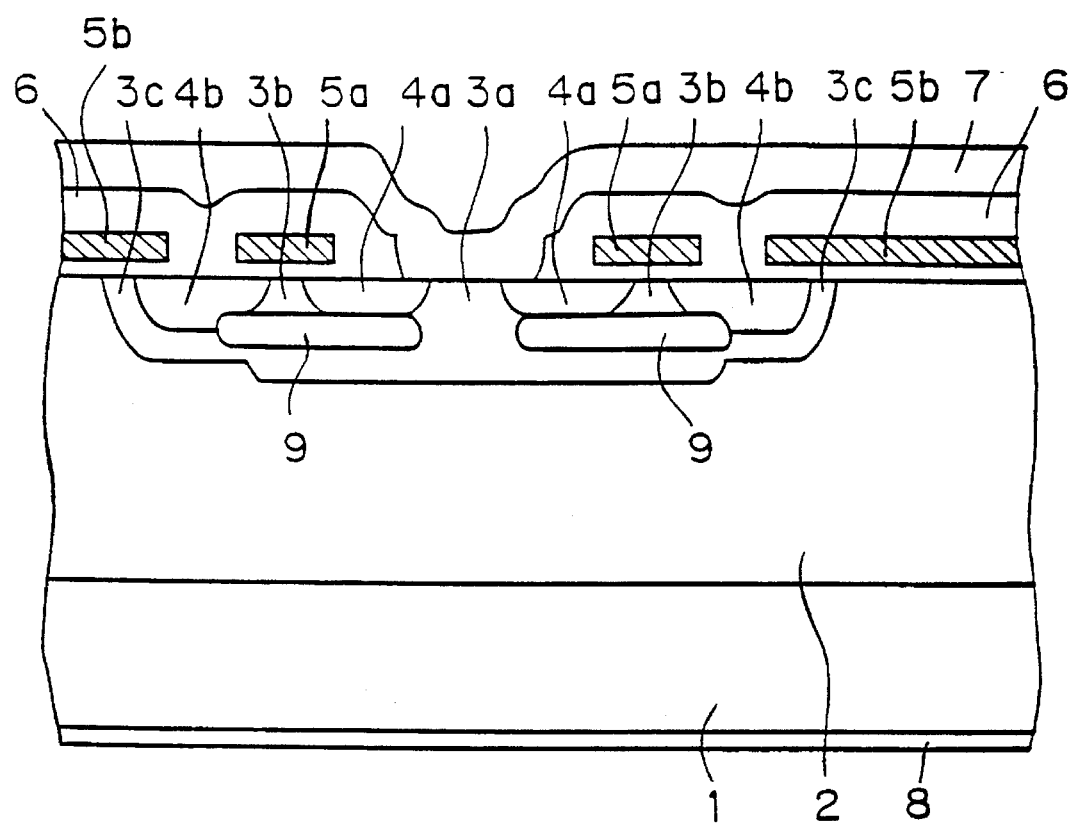
FIG. 12 is a sectional side view of a second preferred embodiment.
Figure 13:
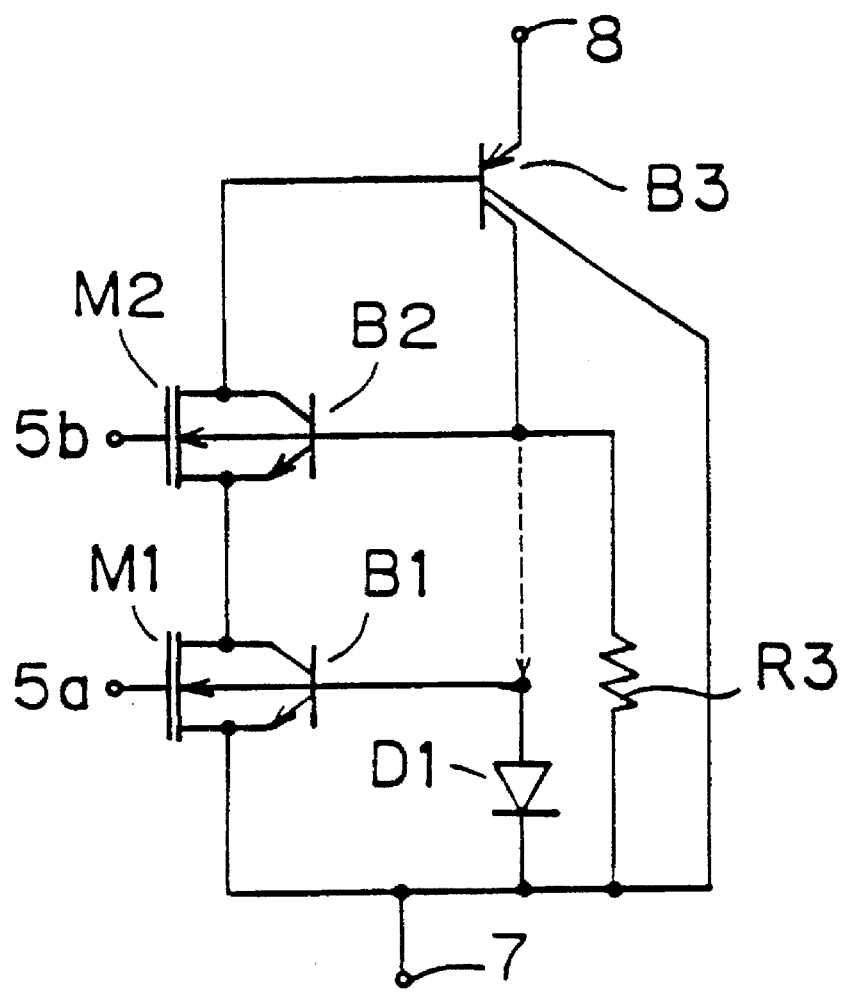
FIG. 13 is an equivalent circuit diagram of the second preferred embodiment.

FIG. 12 shows a second preferred embodiment of the semiconductor device according to the present invention. The second preferred embodiment is different from the first preferred embodiment only in that the p diffusion regions 3a and 3c are contiguous to each other. In other words, the p diffusion region 3a also lies under the oxidation film 9. An equivalent circuit of the second preferred embodiment is shown in FIG. 13. Correspondence of the equivalent circuit in FIG. 13 to the configuration shown in FIG. 12 is similar to that to the first preferred embodiment. However, since the p diffusion regions 3a and 3c are contiguous to each other, a resistance R3 of the p diffusion region 3a formed under the oxidation film 9 is applied between the base electrode of the transistor B2 and the electrode 7.

A case where a potential at the electrode 8 is raised while the electrode 7 and 5 are at the same potential and voltage is retained between the electrodes 7 and 8 will be discussed. In the first preferred embodiment, since the p diffusion region 3c is in floating, withstand (or breakdown) voltage between that and the $n^-$ layer 2 is generally lower than that of the p diffusion region 3a to which a potential is applied by the electrode 7. Thus, there are exhibited a reduction of device withstand voltage and instability thereof, and there are the risks of destruction of the transistor M1 or variation in its threshold voltage $V_{th}$ caused by an avalanche between the p diffusion region 3b and the $n^+$ diffusion region 4b at the time of breakdown or reverse recovery state. In the second preferred embodiment, however, the electrode 7 and the $p^+$ diffusion region 3c are connected by an intervening resistance R3, and hence, such risks can be avoided.

Figure 14:
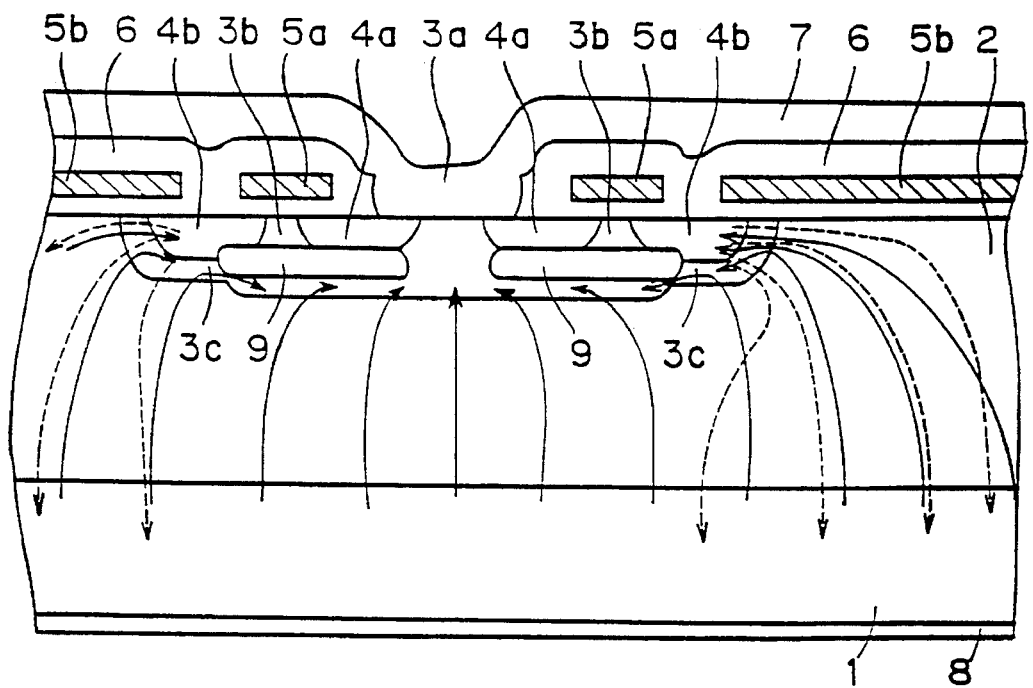
FIG. 14 is a sectional side view showing a flow of carriers in an On-state of the second preferred embodiment.

When voltage at the electrode 5 to the electrode 7 is raised in the above-mentioned situation, the p diffusion regions 3b and 3c just under the electrodes 5a and 5b are negatively inverted, and the transistors M1 and M2 turn on and the semiconductor device accordingly turns on. FIG. 14 shows a flow of carriers when the semiconductor device turns on.

Similar to FIG. 3, a flow of electrons is shown by an arrow of broken line while a flow of holes is shown by an arrow of solid line in FIG. 14. Electrons flow from the n diffusion region 4a via the $n^+$ diffusion region 4b to the n layer 2, and holes are introduced from the $p^+$ substrate 1 to turn the transistor B3 on. Similar to the case in the first preferred embodiment, in the holes introduced therein, relatively large part of them move from the vicinity of the n inversion layer just under the electrode 5b into the p diffusion region 3c.

In the second preferred embodiment, however, part of the holes moved into the p diffusion region 3c flow via the p diffusion region 3a just below the oxidation film 9 to the electrode 7. At this time, hole current flowing in the P diffusion region 3a causes voltage drop in the resistance R3, and forward-biases the $n^+$ diffusion region 4b and the p diffusion region 3c. When the voltage drop proceeds to a certain extent or beyond, the transistor B2 turns on.

When the transistor B2 turns on and the hole current increases to some extent or over, a thyristor consisting of the transistors B2 and B3 is actuated similar to the first preferred embodiment. A current density in such an On-state rises, On-resistance of the thyristor consisting of the transistors B2 and B3 drops, and the total On-resistance also drops.

Similar to the first preferred embodiment, most of the holes introduced into the $n^+$ diffusion region 4b recombinate and not reach the p diffusion region 3b (this is shown by the arrow of broken line in FIG. 2). Thus, in the second preferred embodiment, there is also almost no risk of latch up caused by an actuation of the thyristor consisting of the transistor B1 and B3.

The semiconductor device described in the second preferred embodiment can be turned off in the same way as in the first preferred embodiment. In the second preferred embodiment, moreover, since the p diffusion region 3c is connected to the electrode 7 by the intervening resistance R3, holes accumulated in the p diffusion region 3c can be quickly led to the electrode 7, and therefore, a turn-off speed can be improved.

As in the first preferred embodiment, with the sufficiently thin p diffusion region 3b, a mobility of electrons in the n inversion layer formed therein can be raised, On-resistance of the transistor M1 can be further reduced, the transistor B1 can be extinguished, and the risk of latch up can further be diminished.

Figure 15:
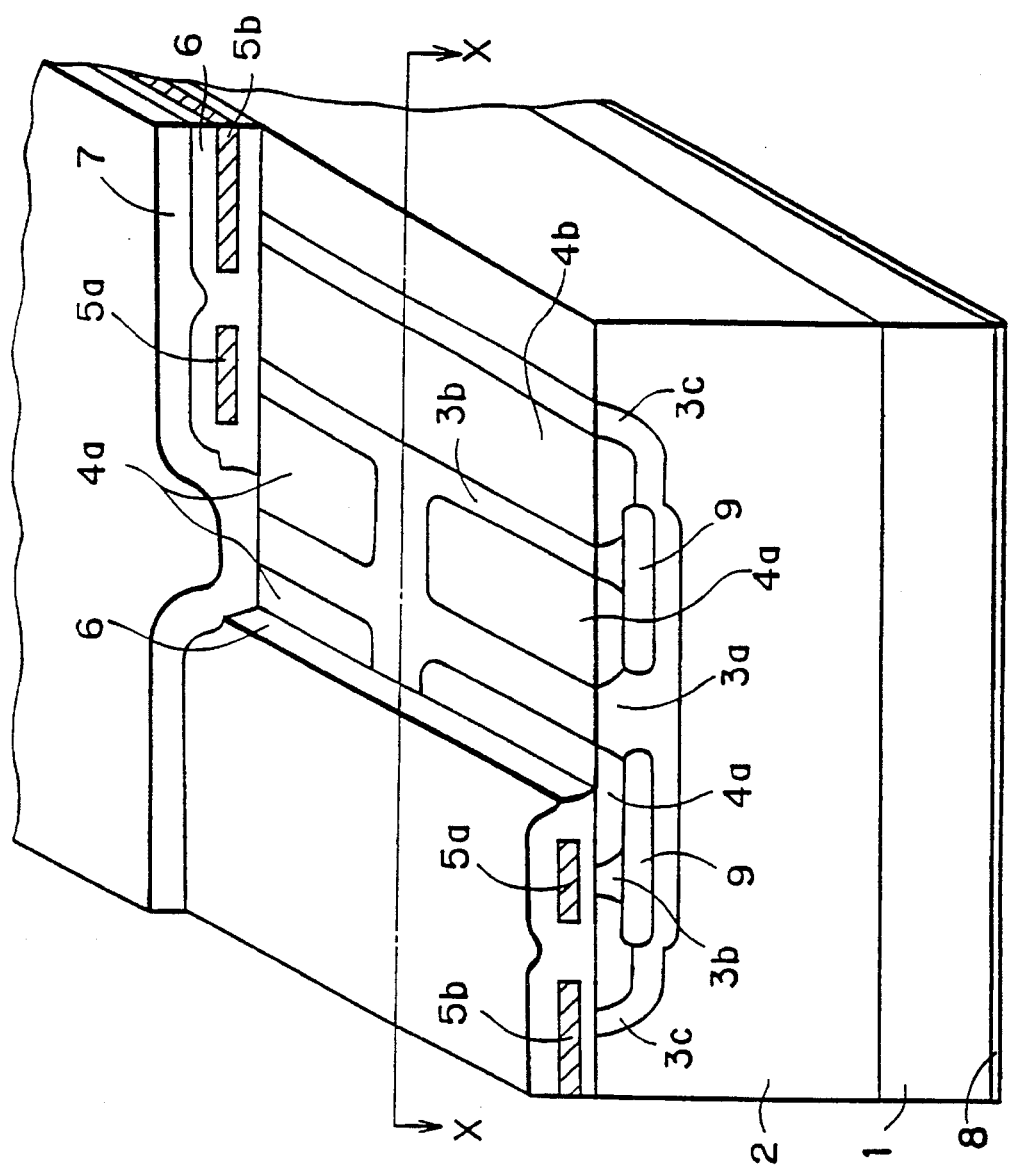
FIG. 15 is a partial sectional view of a variation of the second preferred embodiment.
Figure 16:
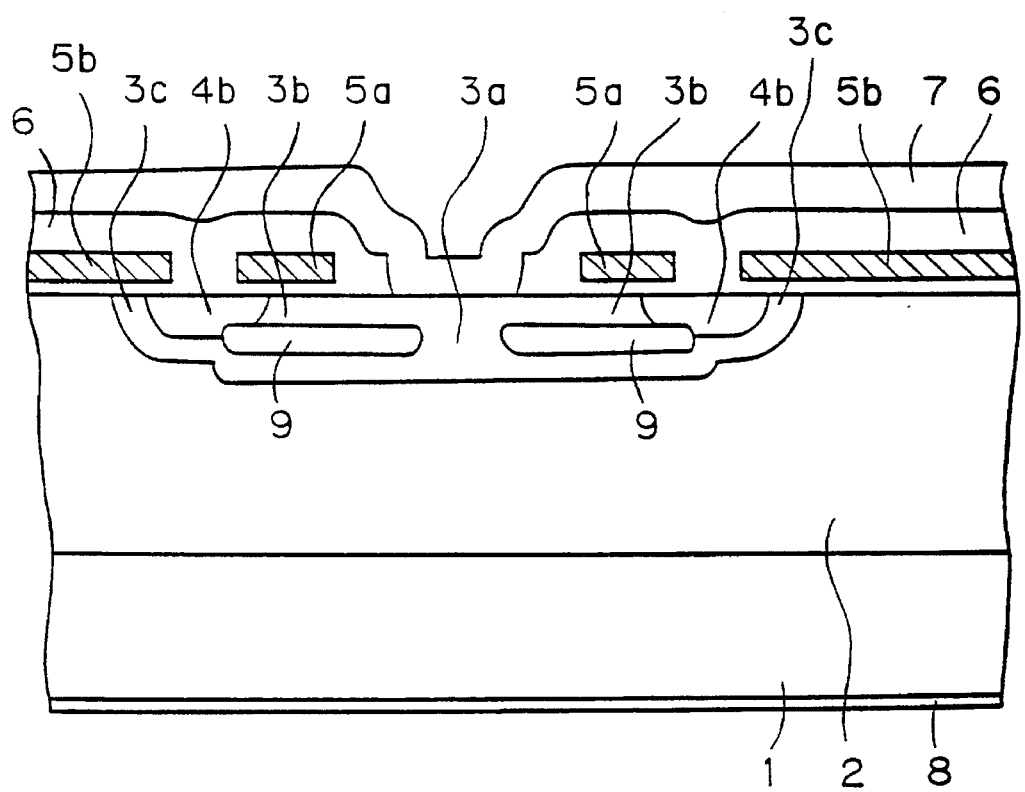
FIG. 16 is an X—X sectional view regarding FIG. 15.

Also as in the variation of the first preferred embodiment, the electrode 7 and the p diffusion region 3b may be in contact with each other so as to stabilize back gate voltage at the transistor M1. FIGS. 15 to 16 show such configurations of variations of the second preferred embodiment.

A cross section presented at the front of FIG. 15 corresponds to the configuration in FIG. 12, where the p diffusion regions 3a and 3b are discretely disposed. In an X—X cross section of FIG. 15 shown in FIG. 16, however, no n diffusion region 4a lies, the p diffusion regions 3a and 3b are in contact with each other, and the p diffusion region 3b can be connected to the electrode 7 by the intervening p diffusion region 3a.

In this case, a diode D1 comprising of the electrode 7 and the base of the transistor B1 is short-circuited in FIG. 13. Thus, almost no voltage drop arises between the emitter and base of the transistor B1.

Figure 17:
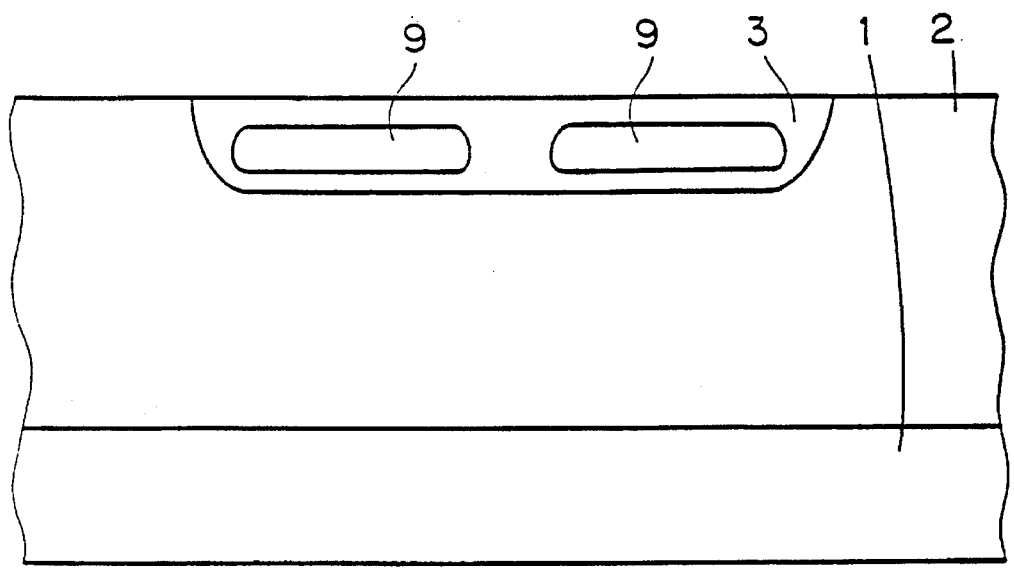
FIG. 17 is a sectional side view showing a method of manufacturing the second preferred embodiment.

Now, a method of manufacturing the second preferred embodiment will be described. First, the $n^-$ layer 2 is formed on the $p^+$ substrate 1 by epitaxial growing. Then, the p diffusion region 3 is selectively formed on a surface of the $n^-$ layer 2, and thereafter, the oxidation film 9 is formed in the p diffusion region 3 similar to the manufacturing method in the first preferred embodiment (FIG. 17). After that, similar to the method shown in FIGS. 7 through 11, the p diffusion regions 3a, 3b and 3c, n⁺ diffusion regions 4a and 4b, electrodes 5a and 5b, electrode insulating film 6, electrodes 7 and 8 are formed. In this way, the semiconductor device having the configuration shown in FIG. 12 can be obtained.

Figure 18:
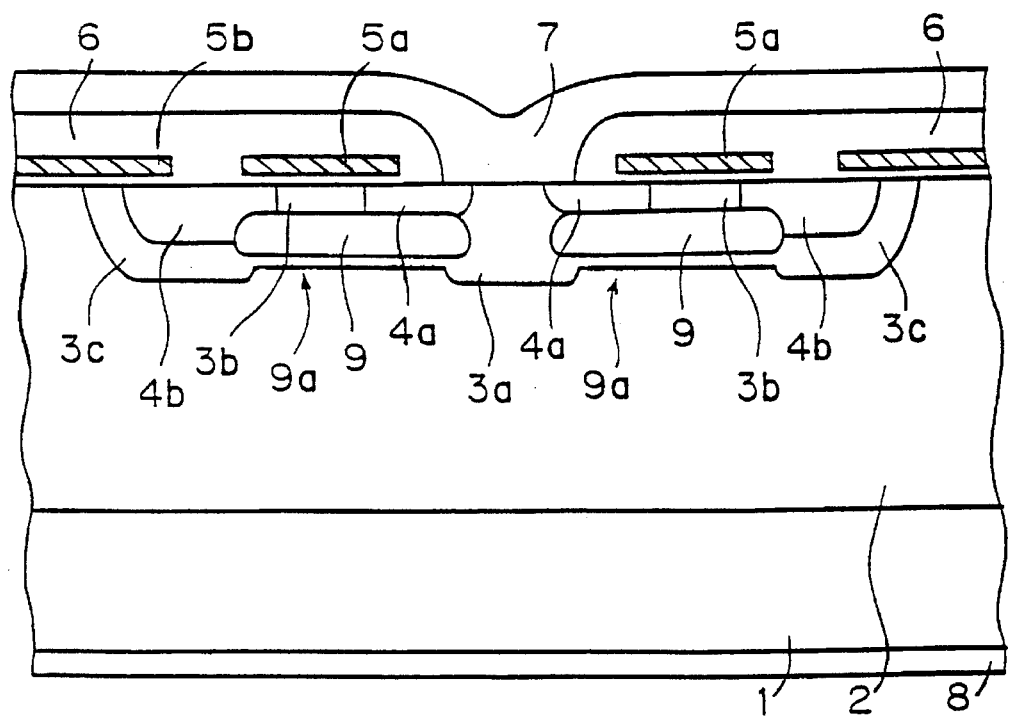
FIG. 18 is a sectional side view showing the method of manufacturing the second preferred embodiment.

Otherwise, the boron ions implantation in FIG. 8 may be performed with higher energy so as to let boron get to under the bottom of the oxidation film 9 or the oxidation film may be thinned so that boron diffusion easily propagates down through the oxidation film 9, and thus, the p diffusion region 3 can be formed below the oxidation film 9. However, the resultant configuration obtained in this way has the p diffusion region 3 in an area 9a under the oxidation film 9 as shown in FIG. 18 formed thinner than the remaining part, unlike the configuration shown in FIG. 12.

C. Third Preferred Embodiment

Figure 19:
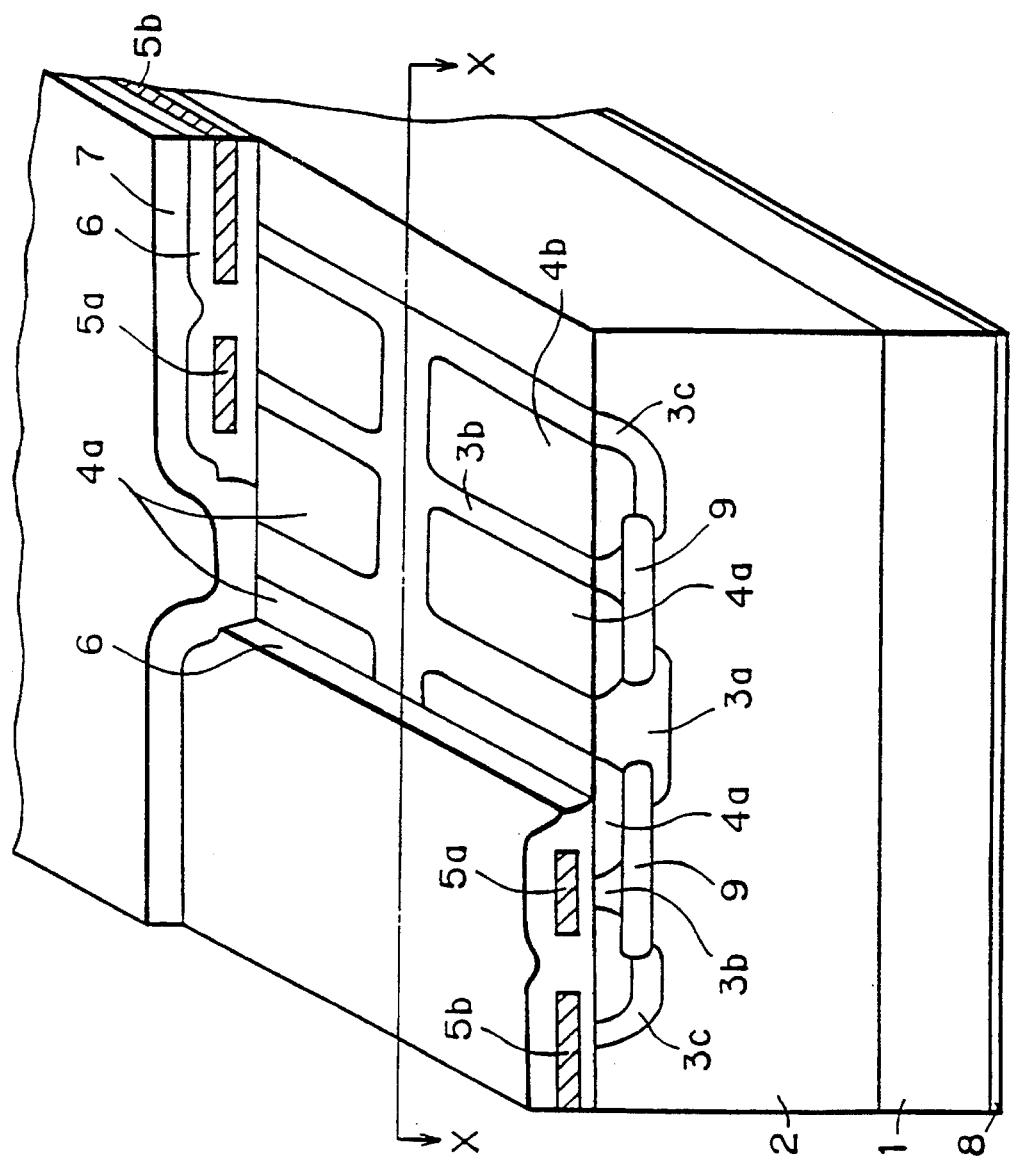
FIG. 19 is a partial sectional view of a third preferred embodiment.
Figure 20:
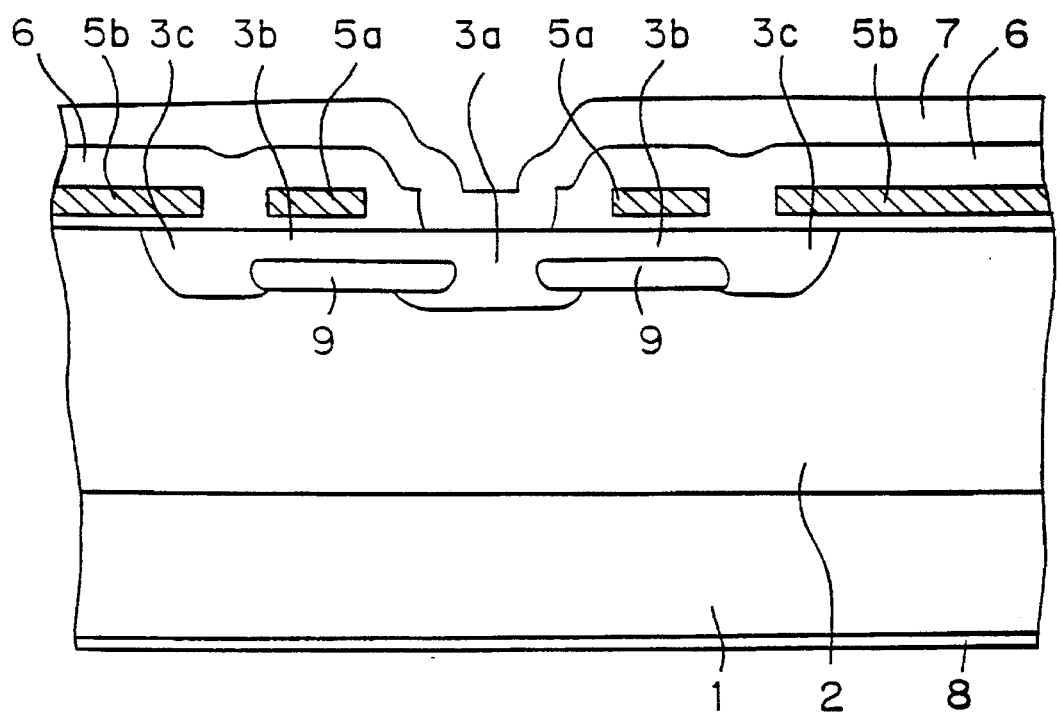
FIG. 20 is an X—X sectional view regarding FIG. 19.

FIG. 19 shows a third preferred embodiment according to the present invention. The third preferred embodiment has a configuration similar to the variation of the first preferred embodiment shown in FIG. 4 and is different from it in that the n⁺ diffusion region 4b is also discretely formed similar to the n⁺ diffusion region 4a. In an X—X cross section of FIG. 19, the configuration with exposure of neither the n⁺ diffusion region 4a nor 4b is shown (FIG. 20).

Figure 21:
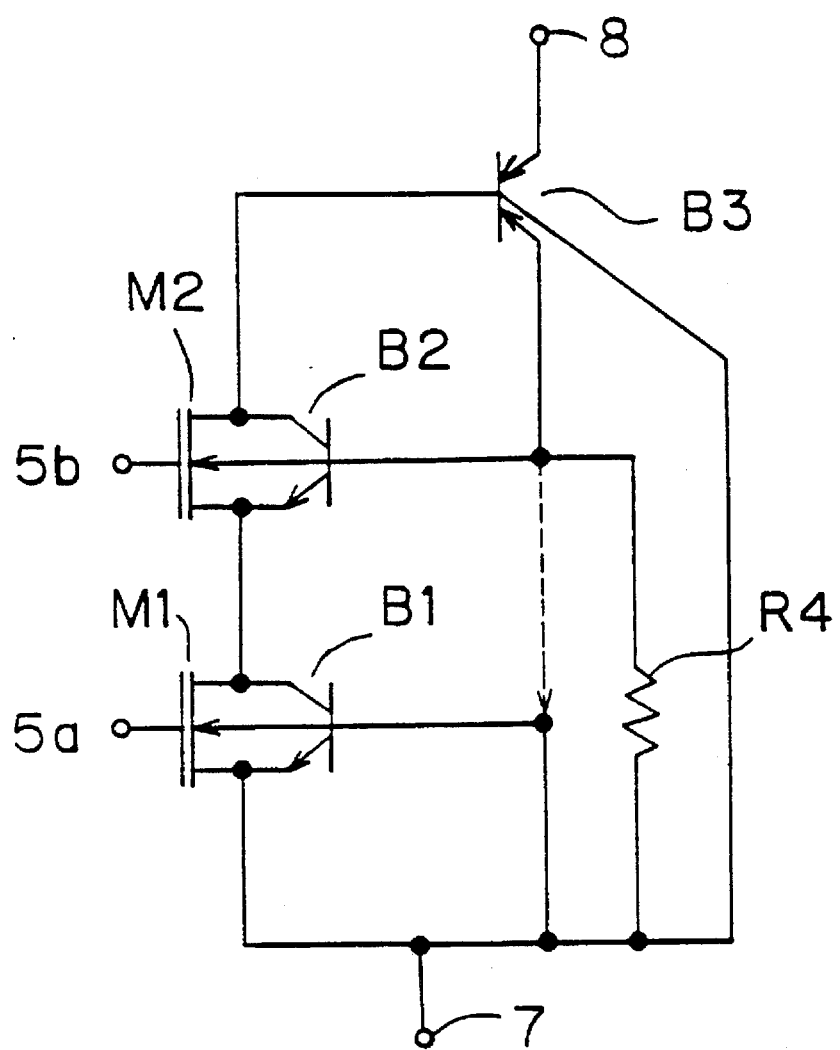
FIG. 21 is an equivalent circuit diagram of the third preferred embodiment.

Similar to the second preferred embodiment, the p diffusion region 3c is connected to the electrode 7 by the intervening p diffusion region in the third preferred embodiment. Specifically, the p diffusion regions 3c and 3b are in contact with each other in a region where no n⁺ diffusion region 4b lies, the p diffusion regions 3b and 3a are in contact with each other in an region where no n⁺ diffusion region 4a lies, and the p diffusion region 3a is connected to the electrode 7. Thus, an equivalent circuit of the third preferred embodiment is shown in FIG. 21 similar to the equivalent circuit of the second preferred embodiment in FIG. 13.

However, the p diffusion region 3b and the electrode 7 is contiguous to each other in the third preferred embodiment, a diode D1 shown in FIG. 13 is short-circuited, the whole of diffusion resistance extending from the p diffusion region 3c via the region without n⁺ diffusion region 4b to the electrode 7 corresponds to a resistance R4.

Since the p diffusion region 3c is connected to the electrode 7 by the intervening resistance R4, the semiconductor device of the third preferred embodiment operates similar to the second preferred embodiment, and the same effect can be attained. Since the p diffusion regions 3b and 3c are connected in the region without the n diffusion region 4b, there is provided a parasitic bipolar transistor which has a base of the p diffusion regions 3b and 3c, an emitter of the n⁺ diffusion region 4a, and a collector of the n⁻ layer 2. However, since the base across the p diffusion regions 3b and 3c is large in length, an amplification factor Hfe is almost zero. And also, the n⁺ diffusion region 4a acting as an emitter and the p diffusion region 3b acting as a part of a base are short-circuited, so that the parasitic transistor does not operate, and hence, there is no need of allowing for this.

D. Fourth Preferred Embodiment

Figure 22:
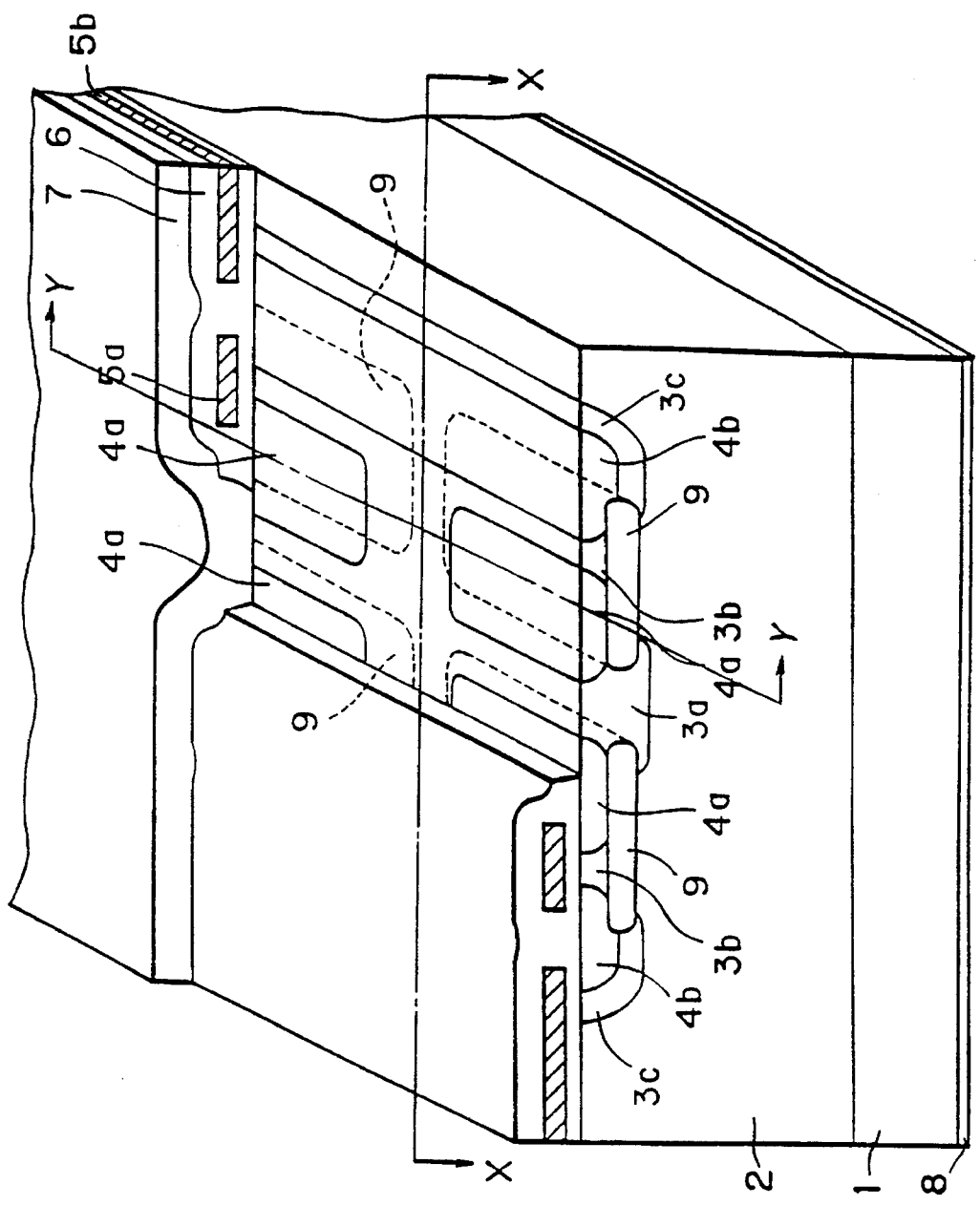
FIG. 22 is a partial sectional view of a fourth preferred embodiment.
Figure 23:
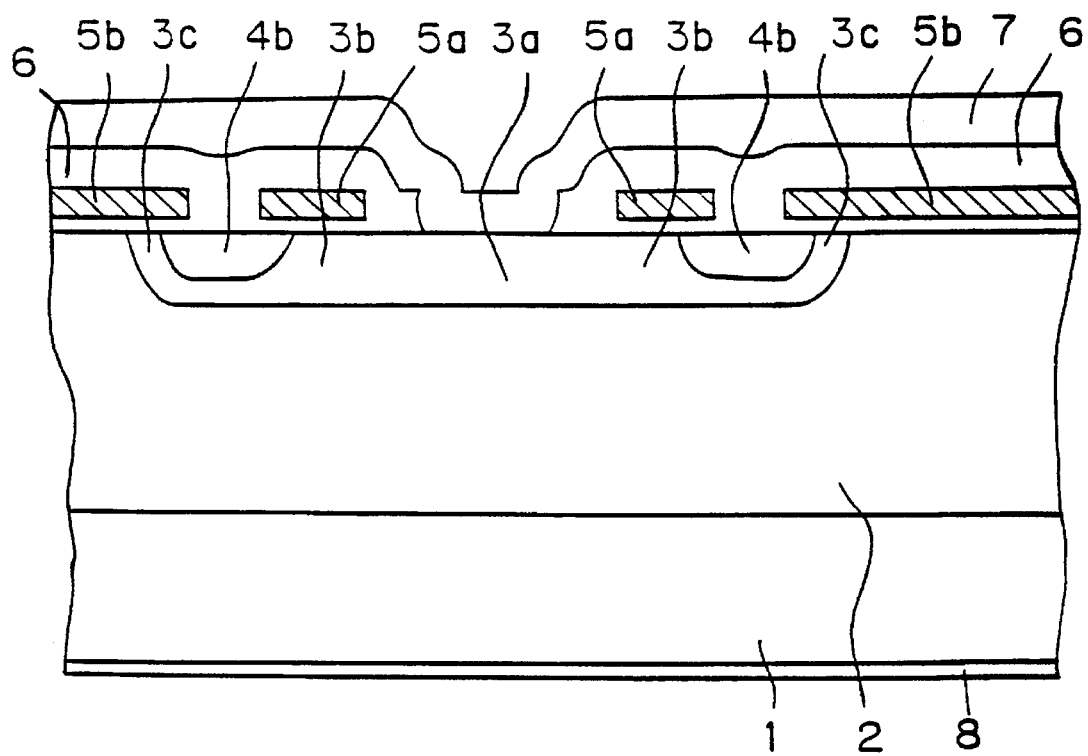
FIG. 23 is an X—X sectional view regarding FIG. 22.

FIG. 22 shows a fourth preferred embodiment according to the present invention. The fourth preferred embodiment has a configuration similar to the variation of the first preferred embodiment shown in FIG. 4, and the difference between them is that the oxidation film 9, similar to the n⁺ diffusion region 4a, is discretely formed in the fourth preferred embodiment. In an X—X cross section of FIG. 22, a configuration where neither n⁺ diffusion region 4a nor oxidation film 9 is exposed (FIG. 23).

Figure 24:
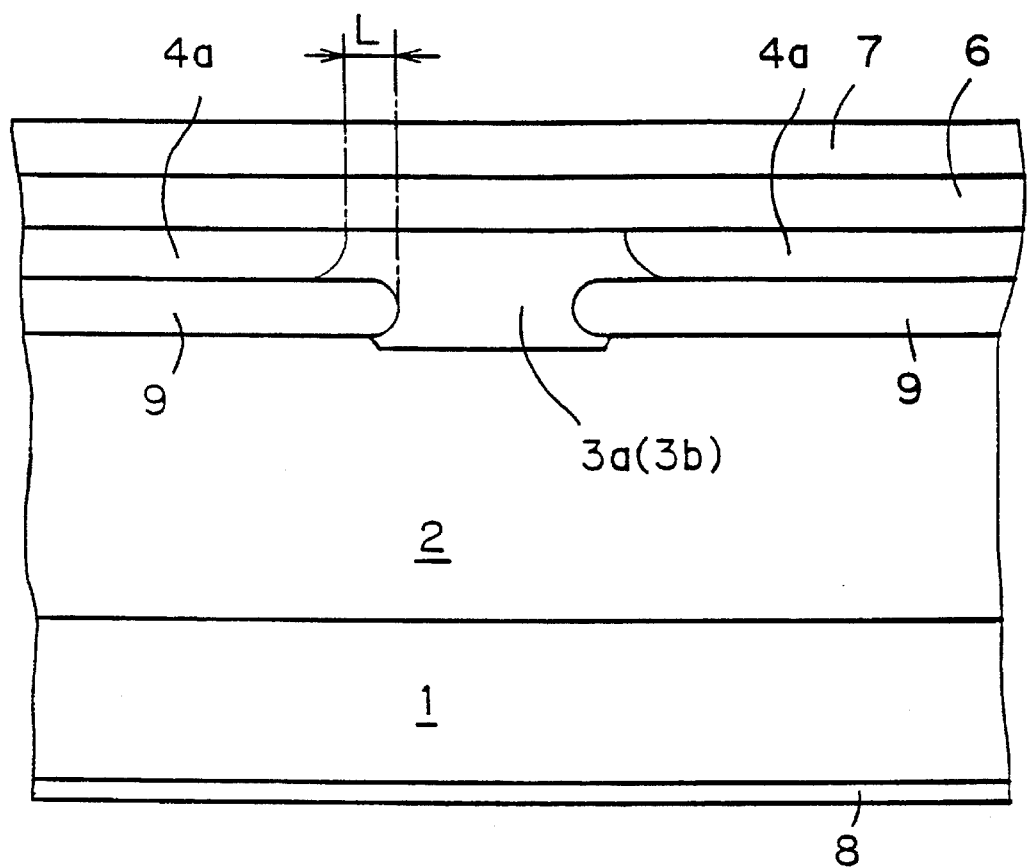
FIG. 24 is a Y—Y sectional view regarding FIG. 22.

A Y—Y cross section of FIG. 22 is shown in FIG. 24. From this figure, it is found that the oxidation film 9 is formed longer by a width L than the n⁺ diffusion region 4a. The width L is about 3 μm, and it maintains a margin in forming the n⁺ diffusion region 4a.

Figure 25:
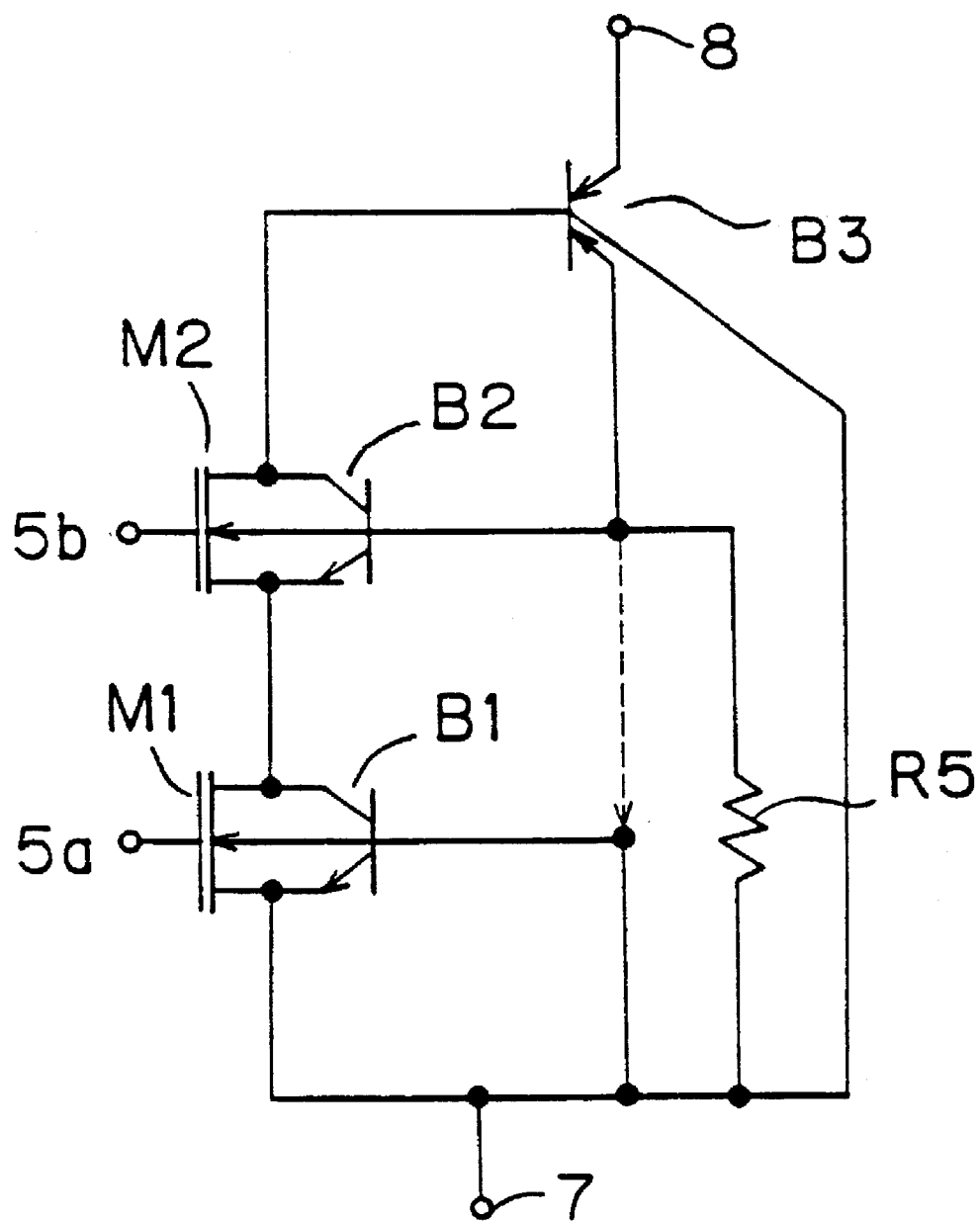
FIG. 25 is an equivalent circuit diagram of the fourth preferred embodiment.

Similar to the preferred embodiment 2, the p diffusion region 3c is connected to the electrode 7 by the intervening p diffusion region in the preferred embodiment 4. Specifically, the p diffusion regions 3c and 3b are contiguous in a region where no oxidation film 9 lies, the p diffusion regions 3b and 3a are contiguous in a region where no n⁺ diffusion region 4a lies, and the p diffusion region 3a is connected to the electrode 7. Thus, an equivalent circuit of the fourth preferred embodiment is shown in FIG. 25 similar to the equivalent circuit of the second preferred embodiment in FIG. 13.

However, since the p diffusion region 3b and the electrode 7 are contiguous to each other in the fourth preferred embodiment, a diode D1 shown in FIG. 13 is short-circuited, and the whole of diffusion resistance extending from the p diffusion region 3c via the region where no oxidation film 9 lies to the electrode 7 corresponds to a resistance R5.

Since the p diffusion region 3c is connected to the electrode 7 by the resistance R5, the semiconductor device of the fourth preferred embodiment operates similar to the second preferred embodiment, and the same effect can be attained.

Since the p diffusion regions 3b and 3c are connected in the region where no oxidation film 9 lies, there is provided a parasitic bipolar transistor having a base of the p diffusion regions 3b and 3c, an emitter of the n⁺ diffusion region 4a, and a collector of the n⁻ layer 2. However, the p diffusion region interposed between the n⁺ diffusion region 4a and the n⁻ layer 2 is long, so that the parasitic transistor does not operate and hence, there is no need of allowing for this transistor.

E. Fifth Preferred Embodiment

Figure 26:
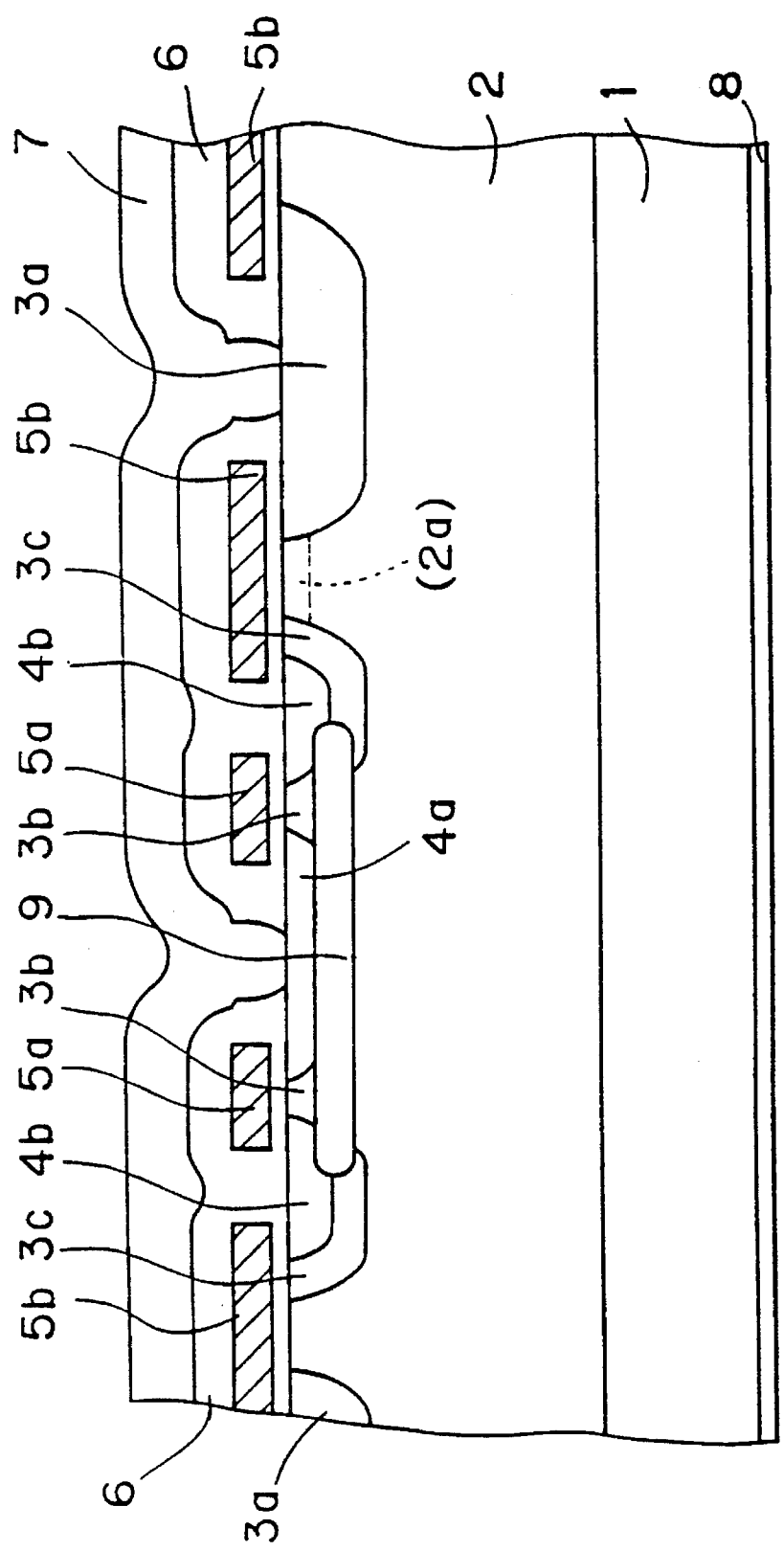
FIG. 26 is a sectional side view of a fifth preferred embodiment.

FIG. 26 shows a fifth preferred embodiment according to the present invention. The fifth preferred embodiment is different from the first preferred embodiment in that the p diffusion region 3a is separated from the remaining p diffusion regions 3b and 3c by the n⁻ layer 2. Moreover, the n⁺ diffusion regions 4a and 4b are formed so that the p diffusion regions 3b and 3c are not contiguous to each other in their respective surface, and therefore, the electrode 7 functions like a bridge between the p diffusion region 3a and the n⁺ diffusion region 4a.

Figure 27:
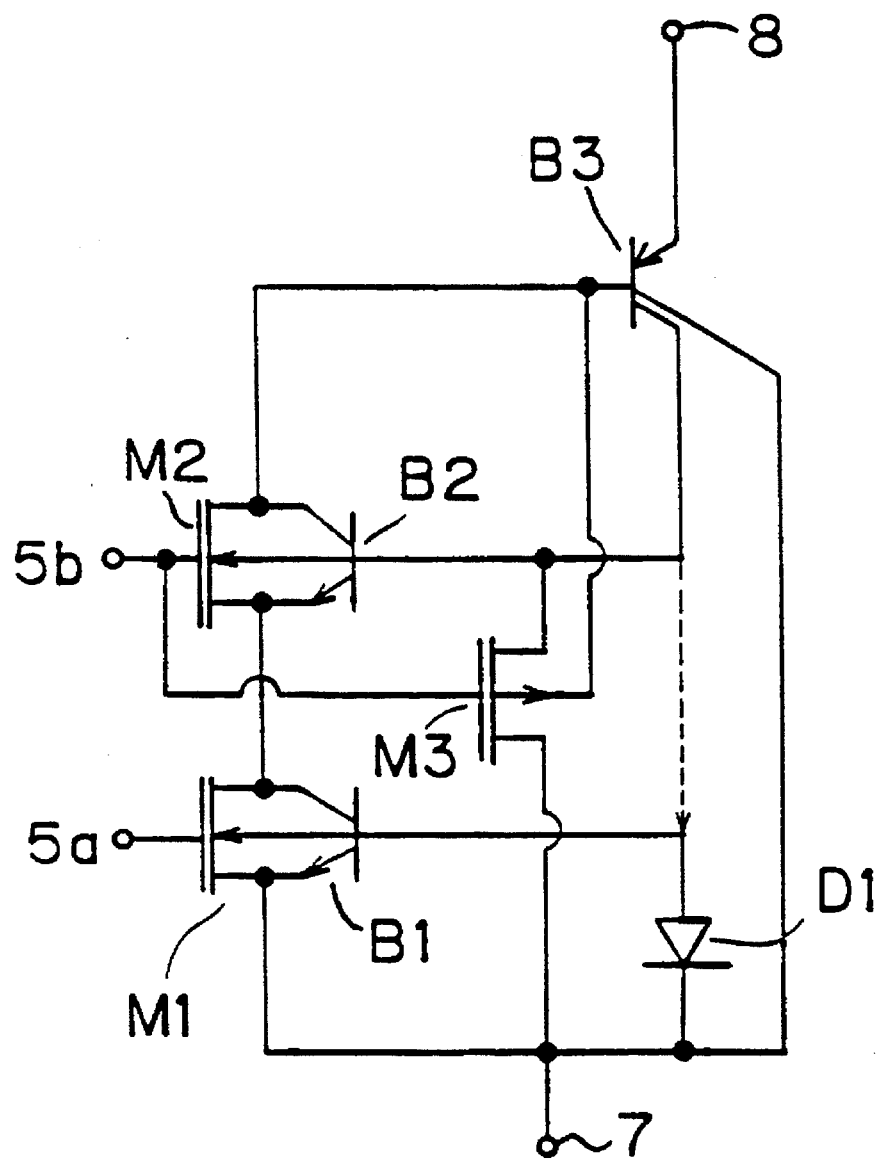
FIG. 27 is an equivalent circuit diagram of the fifth preferred embodiment.

Other components are similar to those in the first preferred embodiment, and an operation is basically the same as that of the first preferred embodiment. A main difference in the operation is that the electrode 5b serves not only as a control electrode of the transistor M2 but also as control electrodes of other MOS transistors. The electrode 5b together with the p diffusion regions 3a and 3c and the n⁻ layer 2 between them make up a p channel MOS transistor M3. FIG. 27 shows an equivalent circuit of the fifth preferred embodiment.

When a potential at the electrode 5b is reduced to turn the transistor M2 off and keep withstand (or breakdown) voltage between the electrodes 7 and 8, the n⁻ layer 2 just under the electrode 5b (hereinafter "semiconductor layer 2a") is positively inverted, and the transistor M3 turns on. This causes the p diffusion region 3c is connected to the electrode 7, and therefore, similar to the second preferred embodiment, the risks of reduction and instability of device withstand voltage, destruction of the transistor M1 caused by an avalanche between the p diffusion region 3b and the n⁺ diffusion region 4b at the time of breakdown or reverse recovery state, or variation in its threshold voltage $V_{th}$, can be eliminated.

Although the similar effects are exerted by the resistance R3 in the second preferred embodiment, on the contrary, when current is caused to flow between the electrodes 7 and 8, holding current sometimes becomes large in the case of a small value of the resistance R3. Contrarily, in the fifth preferred embodiment, in the case where a potential at the electrode 5b is reduced to turn the transistor M2 on, the transistor M3 can be turned off, and the p diffusion region 3c can be brought into a floating state by separating it from the p diffusion region 3a. Hence, there is no risk of having a larger hold current.

When a way of conducting in the semiconductor 2a should be made different from that in the n⁻ layer 2, the semiconductor layer 2a can be more greatly inverted while the transistor M2 turns off. In this case, the separation of the p diffusion region 3c from the p diffusion region 3a can be more effectively performed, letting the transistor M2 turn on. Furthermore, since hole current accumulated in the p diffusion region 3c at turn-off time can be caused to quickly flow in the electrode 7, it is also possible to enhance a turn-off speed. In getting these effects, no adverse effect is exerted to other characteristics.

Rather, when this semiconductor device is actuated at a turn-off potential of 0 volt, for example, the semiconductor layer 2a may be a p-type semiconductor as a seventh semiconductor layer.

Figure 28:
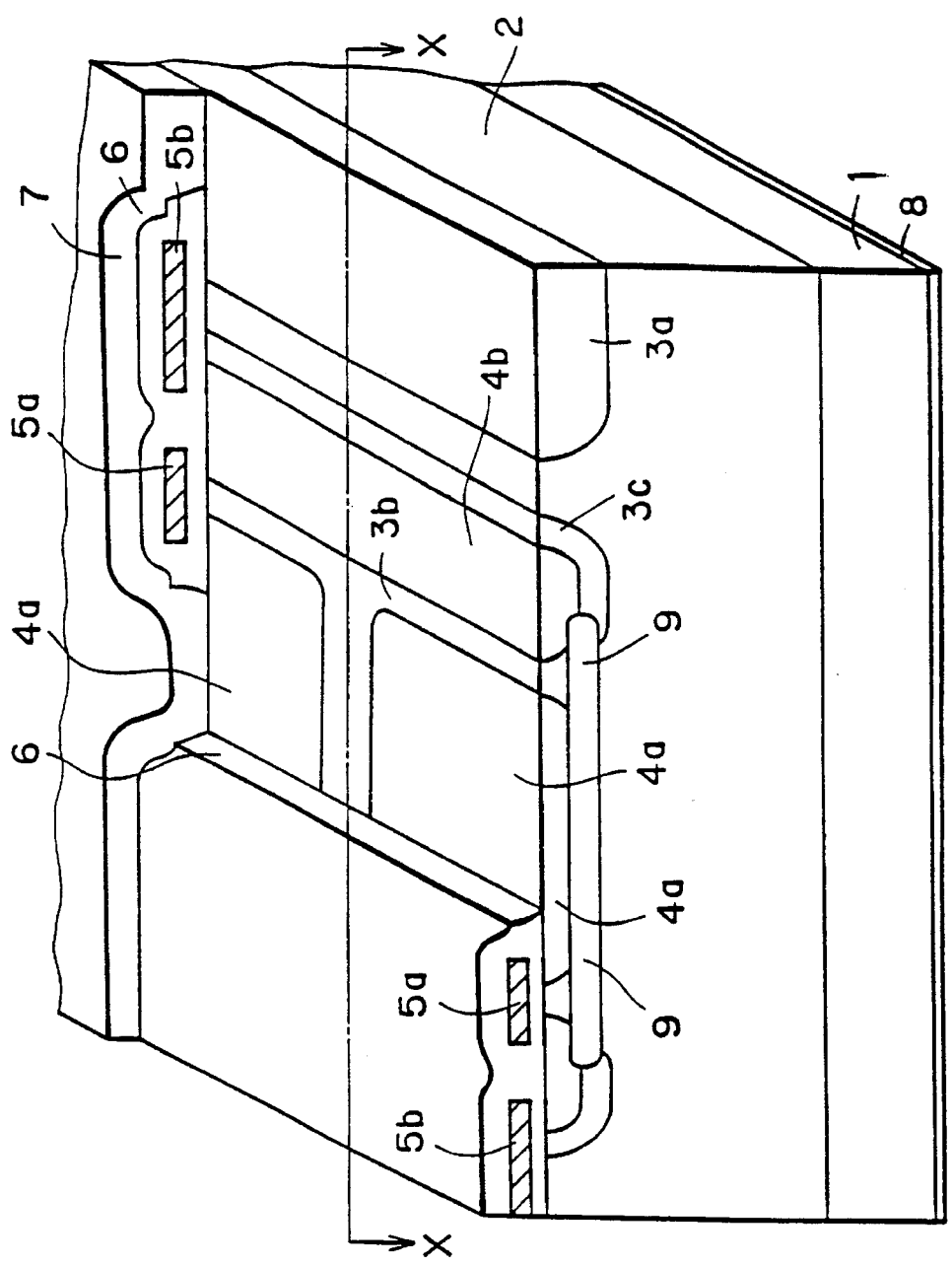
FIG. 28 is a partial sectional view of a variation of the fifth preferred embodiment.
Figure 29:
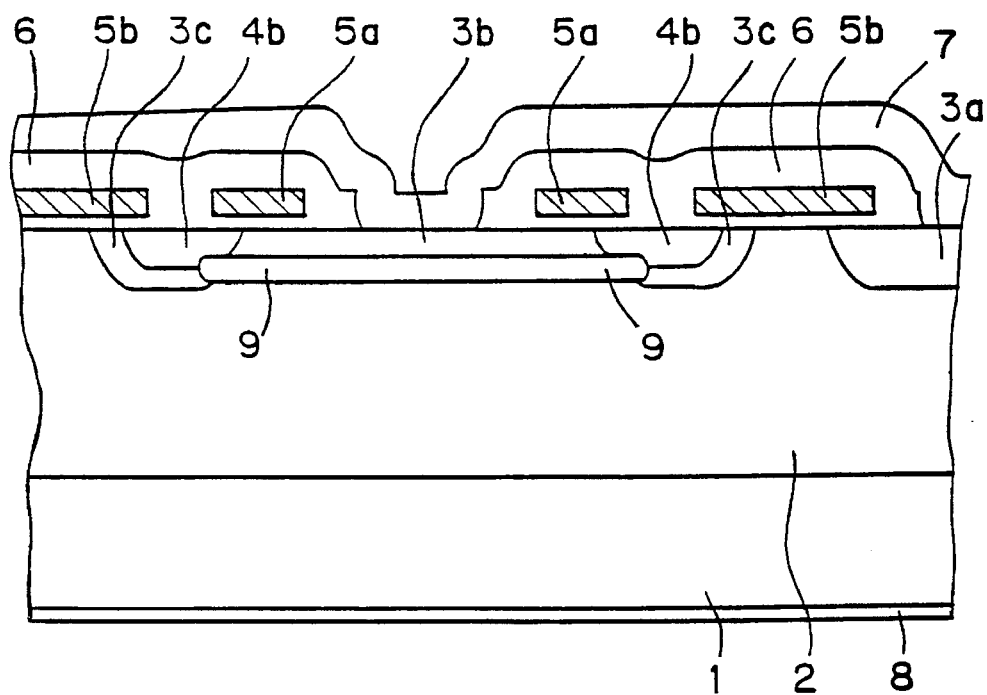
FIG. 29 is an X—X sectional view regarding FIG. 28.

As a variation of the fifth preferred embodiment, similar to the variation of the first preferred embodiment, the p diffusion region 3b and the electrode 7 may be connected to stabilize back gate voltage at the transistor M1. Such a mode is shown in FIGS. 28 and 29. FIG. 29 shows an X—X cross section of FIG. 28. The n⁺ diffusion region 4a is discretely formed as shown in FIG. 28, and the p diffusion region 3b is in contact with the electrode 7 in the range where no n⁺ diffusion region 4a lies (a range presented as a cross section shown in FIG. 29).

F. General Configuration

Although specific modes of the present invention have been described in the first through fifth preferred embodiment, the present invention is not applied only to such specific modes but generally to modes related to configurations as follows.

(F-1) First Mode

Figure 30:
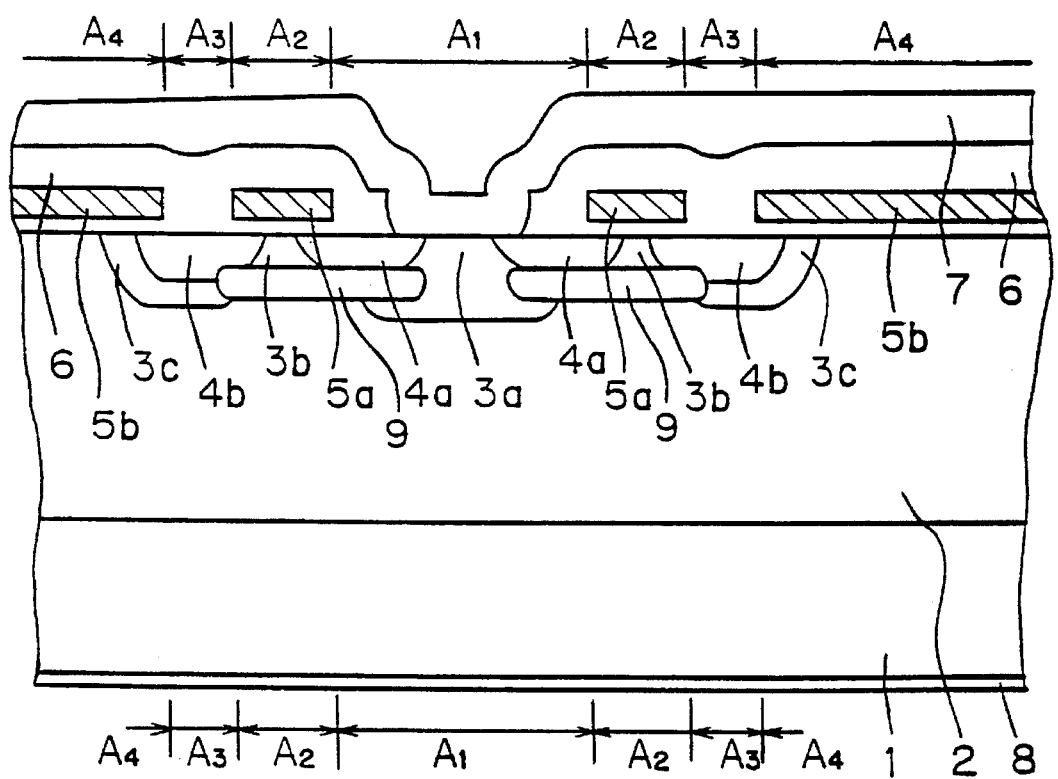
FIG. 30 is a sectional view showing a first preparation.

This mode is common to the first through fourth preferred embodiments and their respective variations. Now, with a representative example of the first preferred embodiment, it will be described. FIG. 30 is a sectional view of the first preferred embodiment similar to FIG. 1.

There is provided a substrate 1 which is a p-type first semiconductor layer having upper and lower major surfaces. Then, the n⁻ layer 2 which is an n-type second semiconductor layer having first through fourth areas $A_1$, $A_2$, $A_3$ and $A_4$ successively located in a first direction orthogonal to a thicknesswise direction of the substrate 1 is formed on the upper major surface of the substrate 1.

The second and fourth areas $A_2$ and $A_4$ are areas where the electrode 5a or the first control electrode, and the electrode 5b or the second control electrode are to be formed thereabove. The first area $A_1$ is the one positioned at a reverse side from the fourth area $A_4$ related to the second area $A_2$. The third area $A_3$ is the one positioned between the second and fourth areas $A_2$ and $A_4$.

The oxidation film 9, or a buried insulating film, is selectively buried in the n⁻ layer 2, extending from at least a first end of the first area $A_1$ to the second area $A_2$.

The p diffusion regions 3a, 3b and 3c, or p-type third semiconductor layers, are formed extending from the first area $A_1$ through the second area $A_2$ and third area $A_3$ to a first end of the fourth area $A_4$ in the upper major surface of the n⁻ layer 2. Specifically, the p diffusion region 3a lies almost in the first area $A_1$, the p diffusion region 3b lies almost in the second area $A_2$, and the p diffusion region 3c lies almost from the third area $A_3$ to the first end of the fourth area $A_4$.

The n⁺ diffusion region 4a, or a n-type fourth semiconductor layer, is formed from a first end of the second area $A_2$ to at least part of a first end of the first area $A_1$, and it is contiguous to the oxidation film 9.

The n⁺ diffusion region 4b, or a n-type fifth semiconductor layer, is formed extending from a second end of the second area $A_2$ isolated from the first end of the second area $A_2$ through the third area $A_3$ to part of the first end of the fourth area $A_4$, and it is contiguous to the oxidation film 9.

The Al—Si electrode 7, or a first current electrode, is connected to the p diffusion region 3a and the n⁺ diffusion region 4a in the first area $A_1$. The metal electrode 8, or a second current electrode, is connected to the lower major surface of the substrate 1.

With such a configuration, because of the intervention of the oxidation film 9, the n⁺ diffusion region 4a hardly has its lower portion connected to the p diffusion region 3a. Hence, the n⁺ diffusion region 4a, p diffusion region 3a, n⁻ layer 2, and substrate 1 never cause an unrequired thyristor operation.

(F-2) Second Mode

Figure 31:
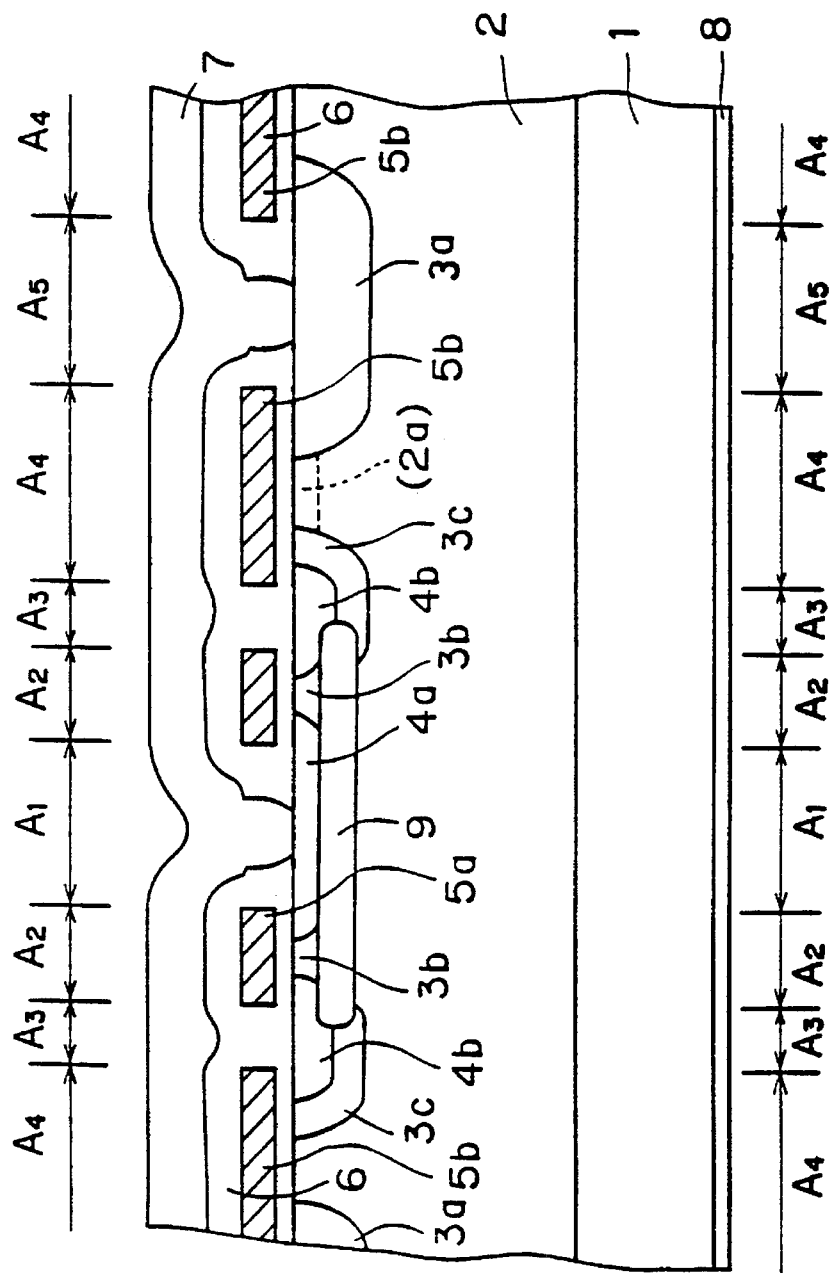
FIG. 31 is a sectional view showing a second preparation.

This mode is common to the fifth preferred embodiment and its variation. Now, with a representative example of the fifth preferred embodiment, it will be described. Similar to FIG. 26, FIG. 31 is a sectional view of the fifth preferred embodiment.

There is provided the substrate 1 which is a p-type first semiconductor layer having upper and lower major surfaces. The n⁻ layer 2, or an n-type second semiconductor layer, having first through fifth areas $A_1$, $A_2$, $A_3$, $A_4$ and $A_5$ successively located in a first direction orthogonal to a thicknesswise direction of the substrate 1 is formed on the upper major surface of the substrate 1.

The second and fourth areas $A_2$ and $A_4$ are areas where the electrode 5a or a first control electrode, and the electrode 5b or a second control electrode are to be formed thereabove. The first area $A_1$ is the one positioned on a reverse side of the fourth area $A_4$ related to the second area $A_2$, the third area $A_3$ is the one between the second area $A_2$ and the fourth area $A_4$, and the fifth area $A_5$ is the one positioned on a reverse side of the third area $A_3$ related to the fourth area $A_4$.

The oxidation film 9, or a buried insulating film, is selectively buried in the n⁻ layer 2, extending from at least the first area $A_1$ to the second area $A_2$.

The p diffusion regions 3b and 3c, or p-type third semiconductor layers, are formed from the first area $A_1$ through the second area $A_2$ and the third area $A_3$ to a first end of the fourth area $A_4$ in the upper major surface of the n⁻ layer 2. Specifically, the p diffusion region 3b lies almost in the second area $A_2$ while the p diffusion region $3c$ lies almost from the third area $A_3$ to almost a first end of the fourth area $A_4$.

The $n^+$ diffusion region $4a$, or a n-type fourth semiconductor layer, is formed extending from a first end of the second area $A_2$ to the first area $A_1$, and it is contiguous to the oxidation film 9.

The $n^+$ diffusion region $4b$, or a n-type fifth semiconductor layer, is formed extending from a second end of the second area $A_2$ isolated from the first end of the second area $A_2$ via the third area $A_3$ to part of the first end of the fourth area $A_4$, and it is contiguous to the oxidation film 9. The $n^+$ diffusion region $4b$ together with the oxidation film 9 and the $n^-$ layer 2 surround the p diffusion region $3c$ to isolate it from the p diffusion region $3a$.

On the other hand, the p diffusion region $3a$, or a p-type sixth semiconductor layer, is formed extending from a second end of the fourth area $A_4$ isolated from the first end of the fourth area $A_4$ to the fifth area $A_5$ in the upper major surface of the $n^-$ layer 2.

The Al—Si electrode 7, or a first current electrode, is connected to the $n^+$ diffusion region $4a$ in the first area $A_1$ and to the p diffusion region $3a$ in the fifth area $A_5$, respectively. Also, the metal electrode 8, or a second current electrode, is connected to the lower major surface of the substrate 1. With such a configuration, the $n^+$ diffusion region $4a$, p diffusion region $3a$, $n^-$ layer 2, and substrate 1 never cause an unrequited thyristor operation. Furthermore, the $n^-$ layer 2 under the electrode $5b$ is inverted when withstand voltage is retained at the electrodes 7 and 8 to form a channel.

As has been described, in a first aspect of the semiconductor device according to the present invention, an unrequited parasitic thyristor is not actuated, and therefore, a maximum controllable current can be made large. In a second aspect of the semiconductor device according to the present invention, enhancement of withstand voltage, stabilization of the withstand voltage, and improvement of a turn-off speed can be attained. Moreover, according to the method of manufacturing the semiconductor device of the present invention, a manufacturing method suitable to the first aspect of the semiconductor device can be provided.

While the invention has been shown and described in detail, the foregoing description is in all aspects illustrative and not restrictive. It is therefore understood that numerous modifications and variations can be devised without departing from the scope of the invention.

We claim:

1. A method of manufacturing a semiconductor device comprising the steps of:

(a) preparing a first semiconductor layer of a first conductivity type having upper and lower major surfaces;

(b) forming a second semiconductor layer of a second conductivity type having first, second, third and fourth regions successively located in a first direction orthogonal to a thicknesswise direction of said first semiconductor layer on said upper major surface of said first semiconductor layer;

(c) forming a buried insulating film which is selectively buried in said second semiconductor layer, extending from at least a first end of said first region to said second region;

(d) selectively forming a first control electrode in said second region above said second semiconductor layer;

(e) selectively forming a second control electrode in said fourth region above said second semiconductor layer;

(f) selectively forming a third semiconductor layer of the first conductivity type in said upper major surface of said second semiconductor layer, located at first, second, and third regions and to a first end of said fourth region;

(g) selectively forming a fourth semiconductor layer of the second conductivity type contiguous to said buried insulating film in said third semiconductor layer, extending from a first end of said second region to at least part of said first end of said first region;

(h) selectively forming a fifth semiconductor layer of the second conductivity type contiguous to said buried insulating film in said third semiconductor layer, extending from a second end of said second region isolated from said first end of said second region through said third region to part of said first end of said fourth region;

(i) forming a first current electrode insulated from said first and second control electrodes, and connected to said third and fourth semiconductor layers in said first region; and (j) forming a second current electrode connected to said lower major surface of said first semiconductor layer.

2. A method according to claim 1, wherein said third semiconductor layer positioned in said second region is formed so as to be thoroughly depleted in a state where withstand voltage is retained between said first and second current electrodes.

3. A method according to claim 1, wherein said step (f) includes the steps of (f-1) introducing a first impurity of the first conductivity type using the first and second control electrodes as a mask; and (f-2) forming said third semiconductor layer by diffusing said first impurity.

4. A method according to claim 3, wherein said step (d) includes the steps of (d-1) selectively forming a first insulating film in said second region on said second semiconductor layer; and (d-2) forming said first control electrode on said first insulating film;

said step (e) includes the steps of (e-1) selectively forming a second insulating film in said fourth region on said second semiconductor layer; and (e-2) forming said Second control electrode on said second insulating film;

and said step (i) includes the steps of (i-1) forming an electrode insulating film over the structure obtained after said step (h);

(i-2) making an aperture through said electrode insulating film in part of said first region and exposing part of said third and fourth semiconductor layers; and (i-3) forming said first current electrode over the structure obtained after said step (i-2).

5. A method according to claim 4, wherein said buried insulating film is formed extending to a first end of said third region.

6. A method according to claim 5, wherein said step (c) includes the steps of (c-1) forming an ion implantation mask for exposing said second semiconductor layer from at least said first end of said first region to said second region;

(c-2) implanting ions, using said ion implantation mask, into said second semiconductor layer; and (c-3) forming said buried insulating film by annealing.

7. A method according to claim 6, wherein said second semiconductor layer is silicon, and said ions are oxygen ions.

8. A method according to claim 6, wherein, said buried insulating film and said second and fifth semiconductor layers surround an end portion of said third semiconductor layer located at said third region and said first end of said fourth region to isolate from the remaining portion of said third semiconductor layer.

9. A method according to claim 8, wherein, said buried insulating film and said fourth and fifth semiconductor layers isolate an intermediate portion of said third semiconductor layer located at said second region other than said end portion thereof from the remaining portion of said third semiconductor layer.

10. A method according to claim 8, wherein said fourth semiconductor layer is formed intermittently along a second direction orthogonal to said thicknesswise direction and said first direction.

11. A method according to claim 6, wherein, a portion of said third semiconductor layer is formed under said buried insulating film and link up extending from said first region to said first end of said fourth region.

12. A method according to claim 11, wherein, said step (f-1) includes the steps of (f-1-1) implanting ions of said first impurity of the first conductivity type using the first and second control electrodes as a mask with sufficient energy to allow ions to pass thru said buried insulating film.

13. A method according to claim 11, wherein said buried insulating film and said fourth and fifth semiconductor layers isolate a portion of said third semiconductor layer from the remaining portion of said third semiconductor layer to form a sixth semiconductor layer of the first conductivity type.

14. A method according to claim 11, wherein said fourth semiconductor layer is intermittently formed along a second direction orthogonal to said thicknesswise direction and said first direction.

15. A method according to claim 6, wherein said fifth semiconductor layer is intermittently formed along a second direction orthogonal to said thicknesswise direction and said first direction.

16. A method according to claim 6, wherein said fourth semiconductor layer is intermittently formed along a second direction orthogonal to said thicknesswise direction and said first direction, and said buried insulating film is intermittently formed along said second direction, intervening between said fourth and second semiconductor layers in said thicknesswise direction.

* * * * *